United States Patent
Sakamoto et al.

(10) Patent No.: US 6,812,410 B2
(45) Date of Patent: Nov. 2, 2004

(54) SEMICONDUCTOR MODULE AND METHOD OF MANUFACTURING THE SAME

(75) Inventors: Noriaki Sakamoto, Gunma (JP); Yoshiyuki Kobayashi, Gunma (JP); Junji Sakamoto, Gunma (JP); Yukio Okada, Gunma (JP); Yusuke Igarashi, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 383 days.

(21) Appl. No.: 09/810,151

(22) Filed: Mar. 16, 2001

(65) Prior Publication Data

US 2002/0050397 A1 May 2, 2002

(30) Foreign Application Priority Data

Oct. 26, 2000 (JP) .................................... P. 2000-326841

(51) Int. Cl.⁷ ................................................ H05K 1/16
(52) U.S. Cl. ...................... 174/260; 174/261; 361/760; 361/783; 257/678
(58) Field of Search ................................ 174/260, 261; 361/760, 764, 767, 777, 783; 257/778, 784, 787, 678

(56) References Cited

U.S. PATENT DOCUMENTS

| | | | |
|---|---|---|---|
| 6,001,671 A | * | 12/1999 | Fjelstad ...................... 438/112 |
| 6,074,898 A | * | 6/2000 | Ohsawa et al. ............. 438/123 |
| 6,201,292 B1 | * | 3/2001 | Yagi et al. ................... 257/666 |
| 6,340,793 B1 | * | 1/2002 | Yaguchi et al. ............. 174/52.4 |
| 6,437,253 B1 | * | 8/2002 | Saito et al. .................. 174/261 |
| 6,462,284 B1 | * | 10/2002 | Hashimoto ................... 174/260 |

OTHER PUBLICATIONS

Nikkei Electronics, vol. 6.16 (No. 691) pp. 92–120 (1997).

* cited by examiner

Primary Examiner—Kamand Cuneo
Assistant Examiner—I B Patel
(74) Attorney, Agent, or Firm—Fish & Richardson PC

(57) ABSTRACT

A first metal film 14 made of a Cu plated film is formed on a radiation substrate 13A made of Al, and an island 15 exposed from a back surface of a semiconductor device 10 is adhered thereto. At that time, the back surface of the semiconductor device 10 is brought into contact with contact areas, and a first opening portion OP is opened larger than an arranging area of the semiconductor device 10. Accordingly, the cleaning can be executed via the first opening portion OP exposed from peripheries of the semi-conductor device 10. In addition, the heat generated from semiconductor elements 16 can be radiated excellently from the island 15 via a second supporting member 13A.

17 Claims, 24 Drawing Sheets

US 6,812,410 B2

SEMICONDUCTOR MODULE AND METHOD OF MANUFACTURING THE SAME

BACKGROUND OF THE INVENTION

The present invention relates to a semiconductor device and a semiconductor module and, more particularly, a structure that is able to radiate excellently the heat from the semiconductor element.

In recent years, application of the semiconductor device to the mobile device and the small and high density packaging device makes progress, and thus not only the reduction in size and weight but also the good radiating characteristic is requested. Also, the semiconductor device is mounted onto various substrates, and the semiconductor module containing the substrate is mounted in various devices. As the substrate, there are the ceramic substrate, the printed circuit board, the flexible sheet, the metal substrate, the glass substrate, etc. Here, as the semiconductor module mounted onto the flexible sheet, an example will be explained hereunder. In this case, it is needless to say that these substrates can be employed in embodiments.

A hard disk 100 into which the semiconductor module employing the flexible sheet is mounted is shown in FIG. 25. For example, this hard disk 100 is described in detail in Nikkei Electronics, 1997, Jun. 16 (No.691), p92-.

This hard disk 100 is packaged into a casing 101 formed of metal, and plural sheet of recording disks 102 are fitted integrally to a spindle motor 103. A magnetic head 104 is arranged over a surface of the recording disk 102 via a minute clearance respectively. This magnetic head 104 is fitted to a top end of a suspension 106 that is fixed to the top of an arm 105. Then, an integral structure consisting of the magnetic heads 104, the suspension 106, and the arm 105 is fitted to an actuator 107.

The recording disks 102 must be connected electrically to a read/write amplifier IC 108 to execute the writing/reading via the magnetic heads 104. Thus, a semiconductor module 110 in which the read/write amplifier IC 108 is mounted onto a flexible sheet 109 is employed. Wirings provided on the flexible sheet 109 are finally connected electrically the magnetic heads 104. The semiconductor module 110 is called the flexible circuit assembly and is normally abbreviated to FCA.

A connector 111 fitted onto the semiconductor module 110 is exposed from a back surface of the casing 101. This connector (male or female type) 111 is connected to another connector (female or male type) fitted to a main board 112. Also, wirings are provided on the main board 112, and also a driving IC for the spindle motor 103, a buffer memory, other driving ICs, e.g., ASIC, etc. are mounted.

For example, the recording disk 102 is rotated by the spindle motor 103 at 4500 rpm, and a position of the magnetic head 104 is decided by the actuator 107. Since this rotating mechanism is tightly sealed by a lid provided to the casing 101, the heat is filled inevitably in the casing 101 and thus the temperature of the read/write amplifier IC 108 is increased. Therefore, the read/write amplifier IC 108 is positioned on the actuator 107, the casing 101, or the like, that has excellent thermal conduction. Also, the rotation of the spindle motor 103 tends to increase such as 5400, 7200, 10000 rpm, and thus this heat radiation becomes important more and more.

In order to explain the above semiconductor module (FCA) 110 further more, a structure of the semiconductor module is shown in FIG. 26. FIG. 26A is a plan view and FIG. 26B is a sectional view in which the read/write amplifier IC 108 provided to the top portion is cut out along an A-A line. Since this FCA 110 is folded and then fitted into a part of the casing 101, a first flexible sheet 109 having a flat shape that can be easily folded is employed.

The connector 111 is fitted to the left end of the FCA 110 to act as a first connector portion. First wirings 121 electrically connected to the connector 111 are stuck to the first flexible sheet 109 and then extended to the right end. Then, the first wirings 121 are electrically connected to the read/write amplifier IC 108. Also, leads 122 of the read/write amplifier IC 108 connected to the magnetic heads 104 are connected to second wirings 123. The second wirings 123 are electrically connected to third wirings 126 on the second flexible sheet 124 provided over the arm 105 and the suspension 106. That is, the right end of the first flexible sheet 109 constitutes a second connecting portion 127, and is connected to the second flexible sheet 124 there. The first flexible sheet 109 and the second flexible sheet 124 may be integrally formed. In this case, the second wirings 123 and the third wirings 126 are integrally provided.

A supporting member 128 is provided on a back surface of the first flexible sheet 109 on which the read/write amplifier IC 108 is provided. The ceramic substrate or the Al substrate is employed as this supporting member 128. The heat generated by the read/write amplifier IC 108 can be discharged since the metals exposed in the casing 101 is thermally coupled with the outside via the supporting member 128.

Then, a connection structure of the read/write amplifier IC 108 and the first flexible sheet 109 will be explained with reference to FIG. 26B hereunder.

This first flexible sheet 109 is formed by laminating a first polyimide sheet 130 (referred to as a "first PI sheet" hereinafter), a first adhering layer 131, a conductive pattern 132, a second adhering layer 133, and a second polyimide sheet 134 (referred to as a "second PI sheet" hereinafter) from the bottom. The conductive pattern 132 is sandwiched between the first PI sheet 130 and the second PI sheet 134.

Also, in order to connect the read/write amplifier IC 108, an opening portion 135 is formed by removing the second PI sheet 134 and the second adhering layer 133 from a desired area to expose the conductive pattern 132. Then, as shown in FIG. 26B, the read/write amplifier IC 108 is electrically connected via the leads 122.

In FIG. 26B, the heat is radiated from the semiconductor device being packaged with an insulating resin 136 to the outside via the heat radiation path indicated by arrows. More particularly, the semiconductor device in the prior art has such a structure that, since an insulating resin 136 acts as a thermal resistance, the heat generated from the read/write amplifier IC 108 cannot be effectively discharged to the outside in total.

Then, the hard disk will be explained hereunder. The transfer rate of the hard disk in reading/writing needs the frequency of 500 MHz to 1 GHz, or more so as to increase the reading/writing speed of the read/write amplifier IC 108. Therefore, the wiring path on the flexible sheet connected to the read/write amplifier IC 108 must be reduced and also the increase in the temperature of the read/write amplifier IC 108 must be prevented.

In particular, since the recording disks 102 are rotated at a high speed and are installed in a space of the casing 101 tightly sealed by the lid, the temperature in the casing 101 is increased up to about 70 to 80° C. In contrast, the allowable operating temperature of the normal IC is about 125° C., and the temperature increase of about 45° C. from the internal temperature of 80° C. can be accepted for the read/write amplifier IC 108. However, as shown in FIG. 26B, if the thermal resistance of the semiconductor device per se or the thermal resistance of the FCA is large, the read/write amplifier IC 108 exceeds immediately the allowable operating temperature and cannot exhibit its essential ability. As a result, the semiconductor device or FCA having the excellent radiation characteristic is requested.

In addition, there is such a problem that, since the operating frequency is further increased in the future, the temperature increase of the read/write amplifier IC 108 itself is brought about by the heat generated by the operating process. Although the target operating frequency can be achieved in the normal temperature, the operating frequency must be lowered because of its temperature increase in the inside of the hard disk.

As described above, with the increase of the operating frequency in the future, the better radiation characteristic is required for the semiconductor device or the semiconductor module (FCA).

In contrast, the actuator 107 itself, or the arm 105 fitted to the actuator 107, the suspension 106, and the magnetic head 104 must be reduced in weight to reduce their moment of inertia. Especially, as shown in FIG. 25, in case the read/write amplifier IC 108 is mounted on the surface of the actuator 107 or the arm 105, the reduction in weight of the IC 108 and the FCA 110 is also requested.

Moreover, as shown in FIG. 27, there is a semiconductor device in which the island 137 of the read/write amplifier IC 108 is exposed from the insulating resin 136 and the back surface of the island 137 and the contact surface of the lead 122 are formed at the same surface level. In this case, there is the problem, since the connecting means such as the solder, etc., that is formed between the lead 122 and the conductive pattern 132, is formed very thin and thus the clearance between the island 137 and the second PI sheet 134 is very narrow, it is difficult to clean this clearance.

SUMMARY OF THE INVENTION

The present invention has been made in view of the above subjects, and can overcome these subjects by satisfying following respects. First, there is provided a semiconductor module comprising: a semiconductor device in which semiconductor elements are sealed integrally by an insulating resin and back surface electrodes that are electrically connected to the semiconductor elements are exposed from a back surface; and a flexible sheet having at least a plurality of conductive patterns, a first insulating sheet for supporting pad electrodes formed at end potions of said conductive patterns and electrically connected to said back surface electrodes, and a second insulating sheet for covering the conductive patterns; wherein an opening portion from which the pad electrodes are exposed and whose size is larger than a back surface of the semiconductor device is formed in the second insulating sheet, and contact areas which come into contact with at least three areas of a back surface of the insulating resin are provided to the opening portion.

If the thickness of contact areas is set to about 40 to 50 $\mu$m or more, the clearance can be formed between the back surface of the semiconductor device and the first insulating sheet and can be cleaned.

Second, the contact areas are formed of the second insulating sheet. As shown in FIG. 1 and FIG. 4, the second insulating sheet is employed as the spacers, the clearance can be formed on the back surface of the semiconductor device.

Third, the contact areas are formed integrally with the second insulating sheet.

Fourth, the contact areas are formed of material which is different from the second insulating sheet.

Fifth, there is provided a semiconductor module comprising: a semiconductor device in which semiconductor elements are sealed integrally by an insulating resin, back surface electrodes that are electrically connected to the semiconductor elements are exposed from a back surface at a same surface level as a back surface of the insulating resin or a hollow surface level rather than the back surface, and an island provided to a lower surface of the semiconductor element is exposed at the same surface level as the back surface of the insulating resin or the hollow surface level rather than the back surface; and a flexible sheet having at least a plurality of conductive patterns, a first insulating sheet for supporting pad electrodes formed at end potions of said conductive patterns and electrically connected to said back surface electrodes, and a second insulating sheet for covering the conductive patterns; wherein a first opening portion from which the pad electrodes are exposed and whose size is larger than a back surface of the semiconductor device is formed in the second insulating sheet, and a second opening portion which exposes the island from a back surface of the first insulating sheet is formed in the first insulating sheet, and contact areas which come into contact with at least three areas of the back surface of the insulating resin are provided between the first opening portion and the second opening portion.

Since the island of the semiconductor device is exposed from the back surface of the flexible sheet, it can be directly adhered to the material having good thermal conductivity. In addition, the clearance can be formed on the back surface of the semiconductor device because the contact areas act as the spacers, this clearance can be cleaned.

Sixth, the contact areas are formed of the second insulating sheet.

Seventh, the contact areas are formed integrally with the second insulating sheet.

Eighth, the contact areas are formed of material which is different from the second insulating sheet.

Ninth, a radiation substrate is stuck onto a back surface of the first insulating sheet to close the second opening portion, and the radiation substrate and the island are thermally coupled with each other.

Since the island and the semiconductor device are thermally coupled with each other by the solder, etc., the heat generated from the semiconductor device can be transferred to the radiation substrate.

Tenth, a first metal film which contains Cu, Ag or Au as major material and is formed by plating is formed as an uppermost layer on a first surface of the radiation substrate, and the first metal film and the island are adhered to (or are brought into contact with) each other by brazing solder, conductive paste, or adhesive material which is excellent in thermal conductivity.

If Al is employed as the radiation substrate, the radiation substrate and the island can be adhered to each other via the brazing solder by forming the Cu, Ag or Au plated film on the outermost surface.

Eleventh, the first surface of the radiation substrate and the island are adhered to (or are brought into contact with) each other by brazing solder, conductive paste, or adhesive material which is excellent in thermal conductivity.

Twelfth, a radiation substrate is stuck onto a back surface of the first insulating sheet to close the second opening portion, and a metal plate containing Cu as a major component is adhered between the radiation substrate and the island.

When the back surface electrodes and the pad electrodes are connected to each other, the clearance is formed between the island and the radiation substrate by the thickness of the conductive pattern and the thickness of the first insulating sheet. In this case, the metal plate having the thickness almost equal to this clearance can be inserted, the island and the radiation substrate can be excellently thermally coupled with each other.

Thirteenth, the island and the metal plate are substantially formed of same material.

If the projection is formed on the island, the island can be thermally coupled with the radiation substrate without employment of another metal plate.

Fourteenth, the radiation substrate and the metal plate are formed integrally of same material.

If the projection is formed by applying the press, etc. to the radiation substrate, the island can be thermally coupled with the radiation substrate without employment of another metal plate.

Fifteenth, there is provided a semiconductor module comprising: a semiconductor device in which semiconductor elements are sealed integrally in a face-up or face-down fashion by an insulating resin, back surface electrodes that are electrically connected to bonding electrodes of the semiconductor elements are exposed from a back surface at a same surface level as a back surface of the insulating resin or a hollow surface level rather than the back surface, and an island provided to a lower surface of the semiconductor element is exposed at the same surface level as the back surface of the insulating resin or the hollow surface level rather than the back surface; and a flexible sheet having at least a plurality of conductive patterns, a first insulating sheet for supporting pad electrodes formed at end potions of said conductive patterns and electrically connected to said back surface electrodes, and a second insulating sheet for covering the conductive patterns; wherein a first opening portion from which the pad electrodes are exposed and whose size is larger than a back surface of the semiconductor device is formed in the second insulating sheet, and a second opening portion from which a radiation substrate being stuck onto an area corresponding to the island is exposed is provided to a back surface of the first insulating sheet, and contact areas which come into contact with at least three areas of the back surface of the insulating resin are provided between the first opening portion and the second opening portion, and the contact areas come into contact with the back surface of the insulating resin, and the island and the radiation substrate are thermally coupled with each other.

Sixteenth, side surfaces of the back surface electrodes and the back surface of the insulating resin extended from the side surfaces of the back surface electrodes have a same curved surface.

Seventeenth, the semiconductor element is a read/write amplifier IC of a hard disk.

Eighteenth, there is provided a method of manufacturing a semiconductor module, comprising the steps of: preparing a semiconductor device in which semiconductor elements are sealed integrally by an insulating resin and back surface electrodes that are electrically connected to the semiconductor elements and an island provided below the semiconductor elements are exposed from a back surface, and a flexible sheet having at least a plurality of conductive patterns, a first insulating sheet for supporting pad electrodes formed at end potions of said conductive patterns and electrically connected to said back surface electrodes, and island-like electrodes adhered to said island, and a second insulating sheet for covering the conductive patterns, wherein an opening portion from which the pad electrodes and the island-like electrode are exposed and whose size is larger than a back surface of the semiconductor device is formed in the second insulating sheet; connecting electrically the pad electrodes and the back surface electrodes and mounting the semiconductor device via spacers provided under the semiconductor device; and cleaning a clearance formed by the spacers via the opening portion exposed from peripheries of the semiconductor device.

Since the cleaning liquid can be permeated into the clearance, the degradation or the failure of the electrical connecting portions arranged in the clearance can be prevented.

Nineteenth, there is provided a method of manufacturing a semiconductor module, comprising the steps of: preparing a semiconductor device in which semiconductor elements are sealed integrally by an insulating resin and back surface electrodes that are electrically connected to the semiconductor elements are exposed from a back surface, and a flexible sheet having at least a plurality of conductive patterns, a first insulating sheet for supporting pad electrodes formed at end potions of said conductive patterns and electrically connected to said back surface electrodes, and a second insulating sheet for covering the conductive patterns, wherein an opening portion from which the pad electrodes are exposed and whose size is larger than a back surface of the semiconductor device is formed in the second insulating sheet; connecting electrically the pad electrodes and the back surface electrodes and mounting the semiconductor device while providing a clearance on a back surface via contact areas provided integrally with the first insulating sheet; and cleaning the clearance formed on the back surface of the semiconductor device via the opening portion exposed from peripheries of the semiconductor device.

Twentieth, there is provided a method of manufacturing a semiconductor module, comprising the steps of: preparing a semiconductor device in which semiconductor elements are sealed integrally by an insulating resin and an island provided below the semiconductor elements and back surface electrodes that are electrically connected to the semiconductor elements are exposed from a back surface, and a flexible sheet having at least a plurality of conductive patterns, a first insulating sheet for supporting pad electrodes formed at end potions of said conductive patterns and electrically connected to said back surface electrodes and from which a radiation substrate stuck onto a back surface is exposed, and a second insulating sheet for covering the conductive patterns, wherein an opening portion from which the pad electrodes and the radiation substrate are exposed and whose size is larger than a back surface of the semiconductor device is formed in the second insulating sheet; connecting electrically the pad electrodes and the back surface electrodes, coupling thermally the island with the radiation substrate, and mounting the semiconductor device while providing a clearance on a back surface via contact areas provided at at least three areas of the back surface of the insulating resin; and cleaning the back surface of the semiconductor device via the opening portion exposed from peripheries of the semiconductor device.

Twenty-first, underfill is mixed into the back surface of the semiconductor device after the cleaning.

BRIEF DESCRIPTION OF THE PREFERRED EMBODIMENTS

DETAILED DESCRIPTION OF THE PREFERRED EMBODIMENTS

The present invention provides a light-weight and small-size semiconductor device having the high radiation characteristic and also provides a semiconductor module in which the semiconductor device is mounted, e.g., a semiconductor module in which the semiconductor device is adhered to (or is brought into contact with) a radiation substrate and a semiconductor module in which the semiconductor device is mounted on the flexible sheet and the radiation substrate is adhered to (or is brought into contact with) a back surface of the flexible sheet (called "FCA" hereinafter), and achieves improvement in the characteristic of a precision equipment, e.g., a hard disk, into which the semiconductor module is installed.

Figure 23:
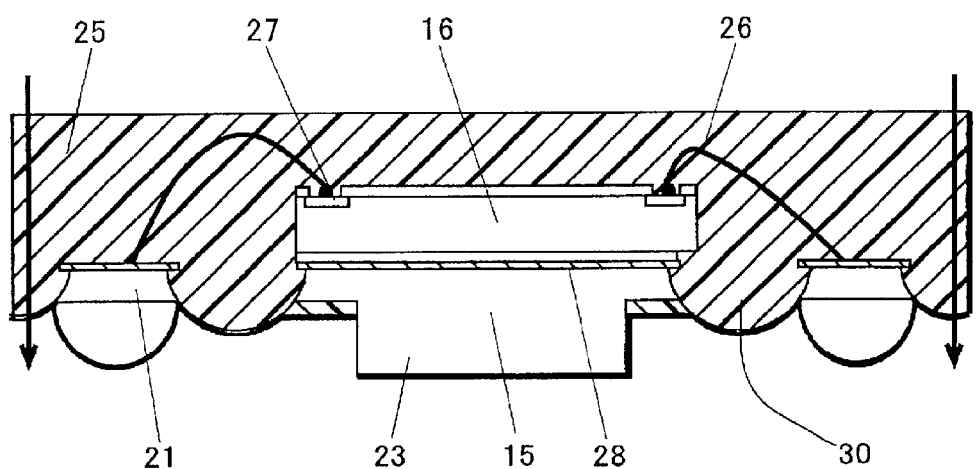
FIG. 23 is a view showing a method of manufacturing a semiconductor device of the present invention.
Figure 24A:
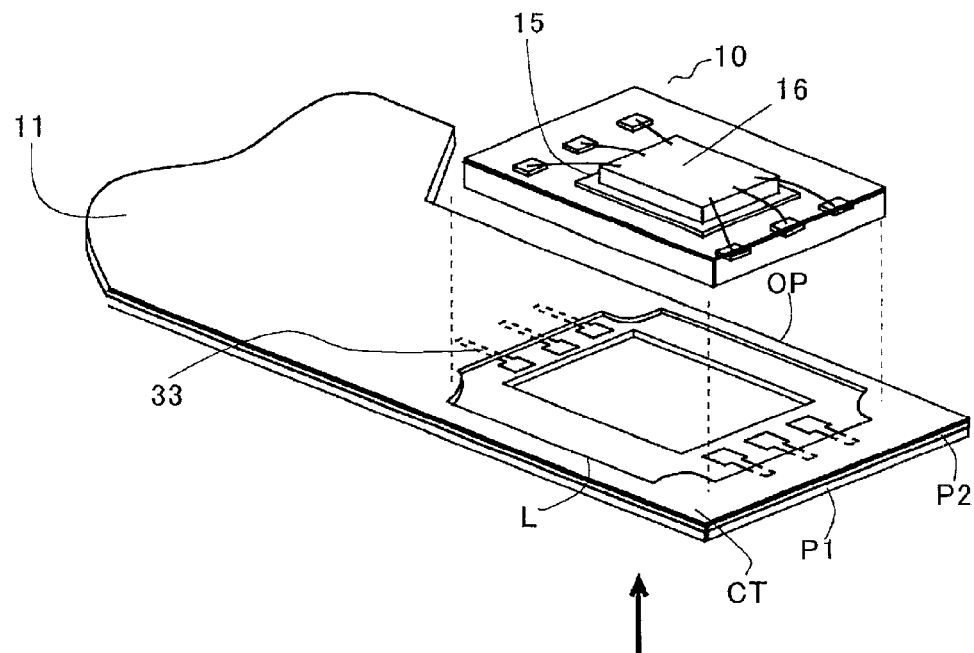
FIG. 24 is a view showing a semiconductor module of the present invention.
Figure 24B:
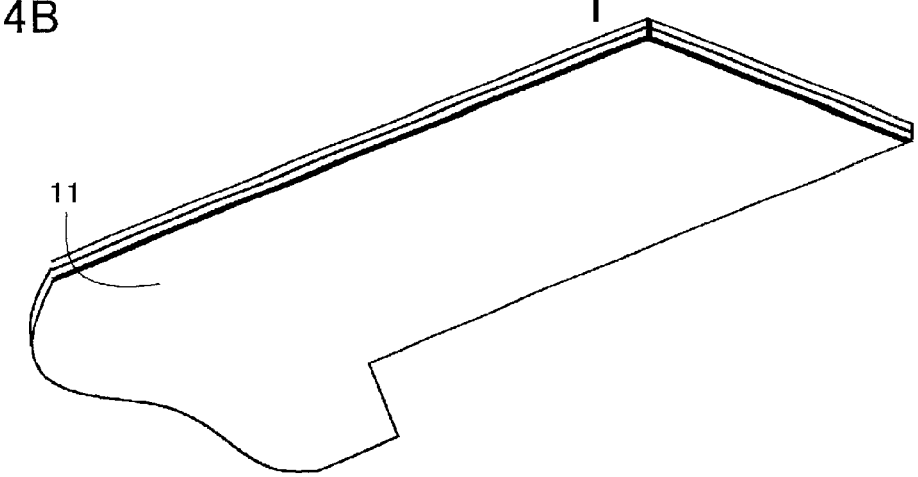
Figure 25:
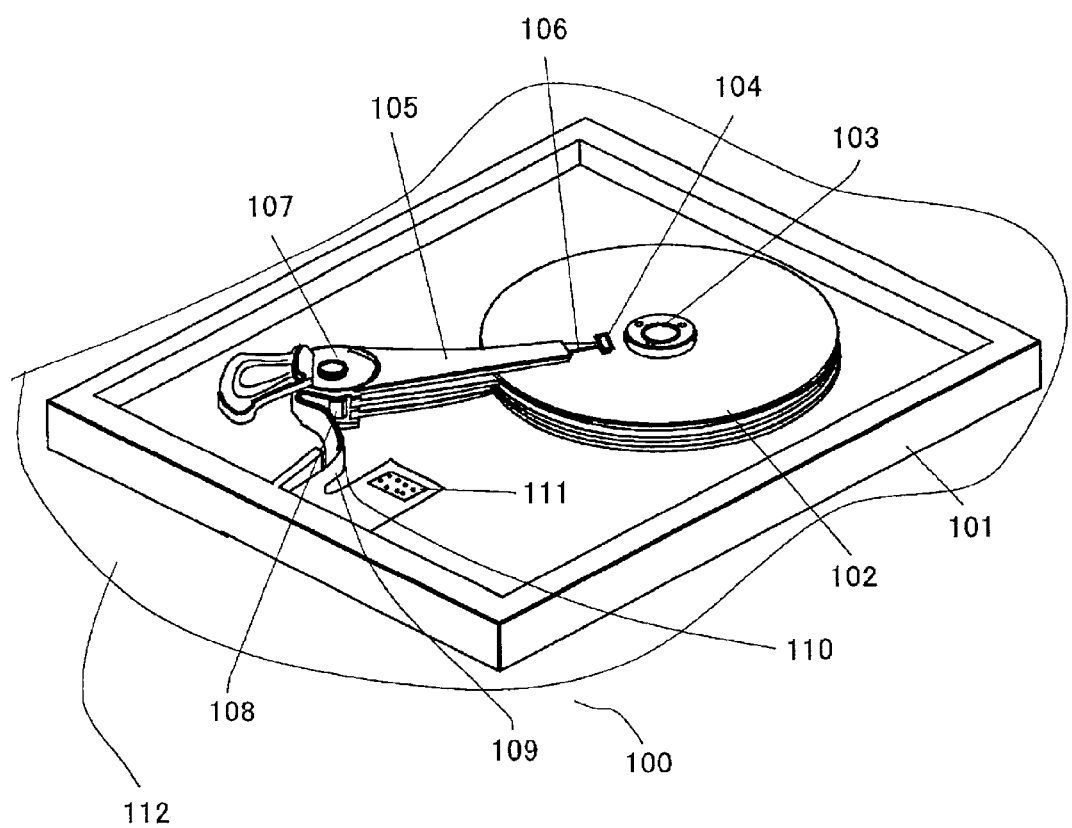
FIG. 25 is a view showing a hard disk.
Figure 26A:
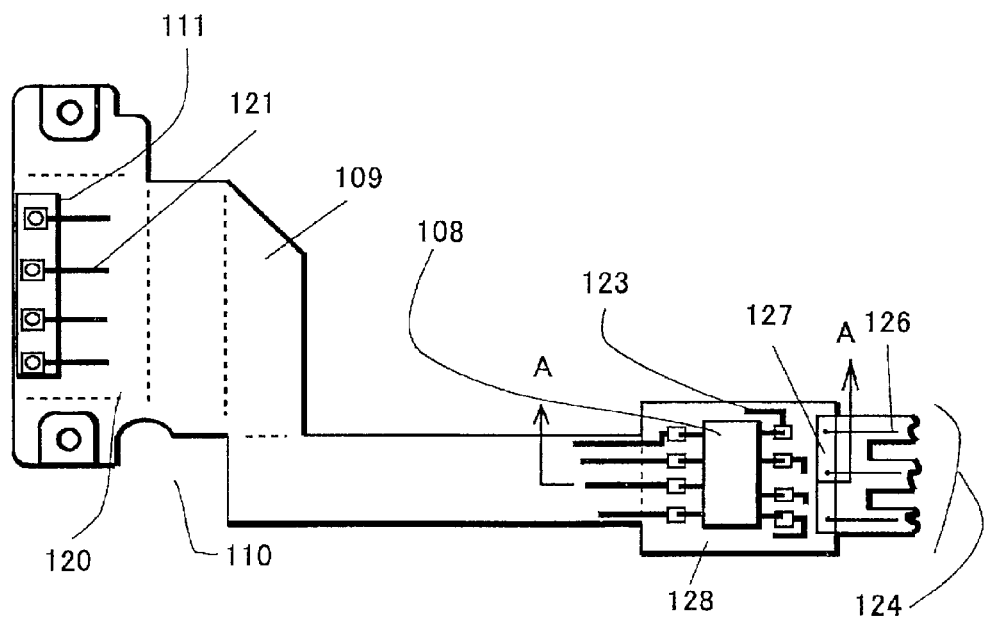
FIGS. 26A and 26B are views showing a semiconductor module employed in FIG. 25 in the conventional art.
Figure 26B:
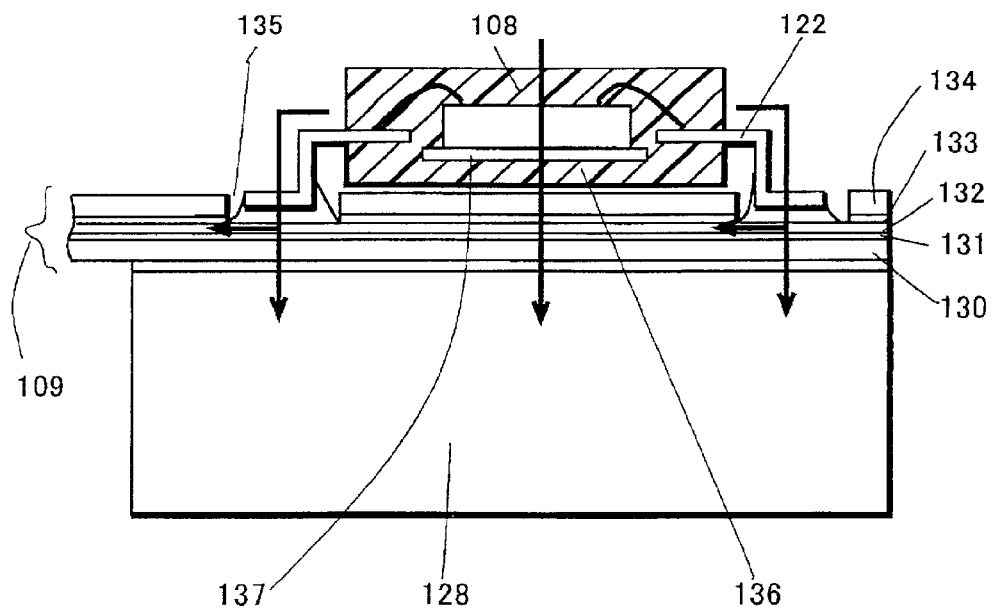
Figure 27:
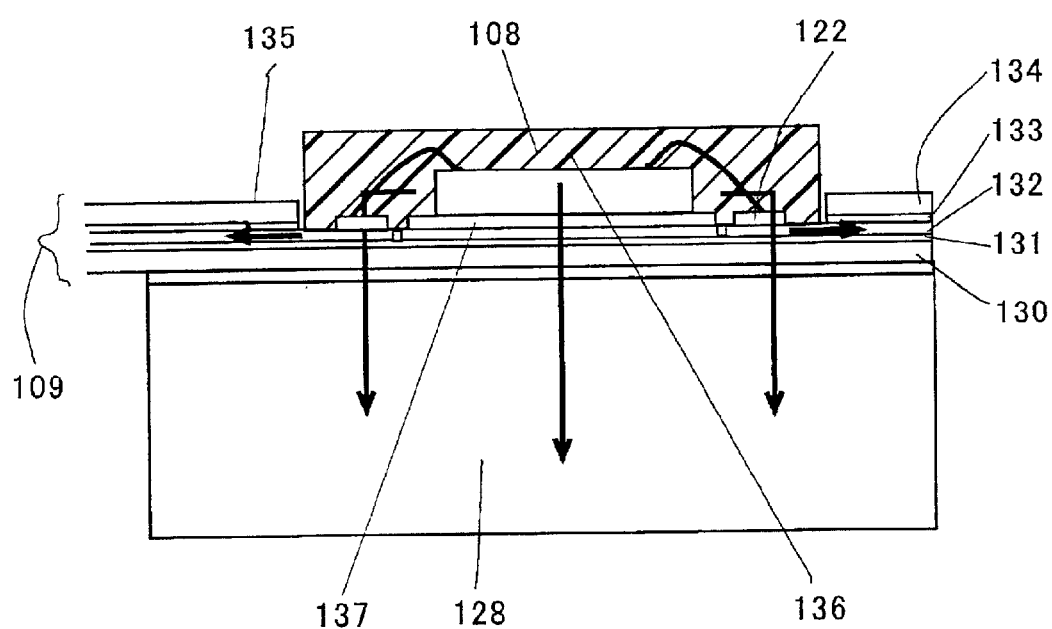
FIG. 27 is a view showing a semiconductor module in the conventional art.

First, a hard disk 100 as an example of the equipment, into which the semiconductor module is installed, is shown in FIG. 25 and the semiconductor module is shown in FIGS. 1 to 4, FIG. 9, FIG. 13, and FIG. 24. Also, the semiconductor device that is mounted in the semiconductor module is shown in FIG. 6 to FIG. 8, FIG. 10 to FIG. 12, FIG. 14 and FIG. 15 and a method of manufacturing the same is shown in FIG. 16 to FIG. 23.

[First Embodiment Explaining the Equipment in Which the Semiconductor Module is Mounted]

As this equipment, the hard disk 100 explained in the prior art column and shown in FIG. 25 will be explained once again.

The hard disk 100 is mounted on the main board 112 at need to install into the computer, etc. A female type (or male type) connector is fitted to this main board 112. Then, the connector is mounted into the FCA, and thus the male type (or female type) connector 111 exposed from a back surface of the casing 101 is connected to a connector on the main board 112. Also, plural sheets of recording disks 102 as recording medium are laminated in the casing 101 according to its capacity. Since the magnetic head 104 is scanned while floating over the recording disk 102 with a gap of almost 20 to 30 nm, an interval between the recording disks 102 is set to an interval that causes no trouble in such scanning. Then, the recording disks 102 are attached to the spindle motor 103 to keep this interval. The spindle motor 103 is fitted to a mounting substrate, and the connector arranged on a back surface of the mounting substrate is exposed from the back surface of the casing 101. Then, this connector is connected to the connector of the main board 112. Accordingly, an IC for driving the read/write amplifier IC 108 of the magnetic head 104, an IC for driving the spindle motor 103, an IC for driving the actuator 107, a buffer memory for temporarily saving the data, ASIC used to achieve the original drive of the maker, etc. are mounted on the main board 112. Of course, other passive elements and active elements may be mounted on the main board 112.

Figure 1A:
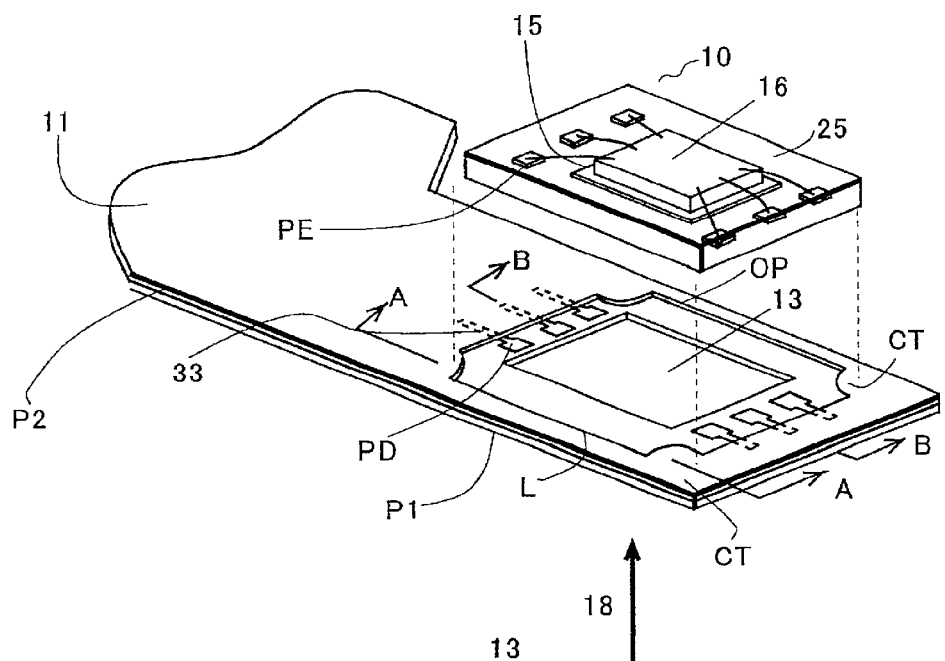
FIG. 1 is a view showing a semiconductor module of the present invention.

Then, wirings for connecting the magnetic heads 104 and the read/write amplifier IC 108 are considered as short in length as possible, and the read/write amplifier IC 108 is arranged in the actuator 107. However, since the semiconductor device of the present invention explained hereinafter is small in size and light in weight, such semiconductor device may be mounted on the arm 105 or the suspension 106 except the actuator. In this case, as shown in FIG. 1A, since the back surface of the semiconductor device 10 is exposed from the second opening portion 13 of the first supporting member (flexible sheet) 11, such back surface of the semiconductor device 10 is thermally coupled with the arm 105 or the suspension 106, the heat of the semiconductor device 10 can be emitted to the outside via the arm 105 and the casing 101.

If the semiconductor device is mounted in the actuator 107 as shown in FIG. 25, all reading/writing circuits for respective channel of the read/write amplifier IC 108 are formed by a one-chip device such that a plurality of magnetic sensors can read and write. In this case, the reading/writing circuits used exclusively for the magnetic heads 104 fitted to respective suspensions 106 may be mounted in respective suspensions or arms. In this manner, wiring distances between the magnetic heads 104 and the read/write amplifier IC 108 can be considerably shortened rather than the structure shown in FIG. 25. Thus, the reduction in the impedance can be achieved accordingly and thus the improvement of the reading/writing speed can be achieved.

Since the magnetic head 104 is scanned while floating over the recording disk 102 with a gap of almost 20 to 30 nm, it is apt to be very easily damaged by particles. That is, since the high precision electronic equipment has a driving portion and a sliding portion, an Al substrate that is light in weight and hardly generates the particles is employed as a radiation substrate 13A.

Al is light and excellent in the thermal conduction, and an oxide film formed on a surface is thin and dense. If this dense oxide film is formed once, the oxygen is hard to reach Al and thus the growth of the oxide film is almost stopped. That is, in the above precision equipment, an oxide film is easily grown on Cu, for example, and an amount of particles generated from the oxide film is increased to cause the malfunction as the oxide film is grown much more in the equipment. However, the growth of the oxide film is reduced on the substrate that employs Al or stainless steel as major material, the generation of the particles is small correspondingly and thus the damage or the malfunction of the recording disk can be reduced.

Figure 5A:
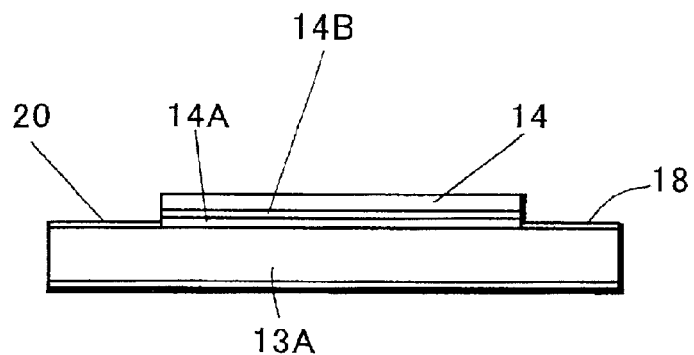
FIGS. 5A to 5C are views showing a radiation substrate and a metal film formed on the radiation substrate.

In contrast, Al and the oxide formed on the surface of Al have no affinity for conductive adhering material (brazing solder such as solder, etc., conductive paste such as Ag, Au, etc.). However, a first metal film 14 using Cu, Ag, or Au as major material can be formed on the surface of Al. This is shown in FIG. 5. Therefore, if this first metal film 14 is formed on an Al radiation substrate 13A, an island 15 exposed from the back surface of the semiconductor device 10 can be thermally coupled with the radiation substrate 13A via the conductive adhering material (the brazing solder, the conductive paste, the anisotropic conductive resin, etc.). As a result, the Al substrate can be caused to operate as the radiation substrate 13A that hardly generates the particles and has excellent thermal conductivity.

[Second Embodiment Explaining the Radiation Substrate 13A]

The fact is known that, since Al oxide is formed on the surface of the radiation substrate 13A using Al as major material, the metal cannot be adhered onto the surface via the brazing solder such as solder, the conductive paste, or the like. Accordingly, it is known that there is no means to adhere the Al substrate and the island 15 exposed from the back surface of the semiconductor device 10 except that they must be adhered to each other via the adhesive or the insulating connecting means having good thermal conduction.

However, Al can be plated with Cu, Ag, or Au by the plating method. Thus, as shown in FIG. 5, if the plated film can be formed as the first metal film 14, the metal body 15 such as the island, the metal plate, etc. can be adhered onto the plated film via the brazing solder.

In addition, since no insulating material is interposed between the island 15 and the radiation substrate 13A, the thermal resistance is very small. Thus, the heat generated from the semiconductor element 16 can be emitted from a metal member constituting an electronic equipment to the outside.

Then, a method of forming the metal film made of Cu on the Al substrate will be explained hereunder.

First, the Al substrate is lightly etched with ammonium persulfate and then immersed in an acid such as sulfuric acid, etc. A concentration of the sulfuric acid is 100 ml/l, and the Al substrate is immersed at the atmospheric temperature for about one minute. In this case, l indicates liter.

Second, the oxide film and the contamination on the Al substrate is removed and then Pd 14A acting as the catalyst is arranged. Especially, since Pd 14A is separated out concentratively into one area, the process for scattering Pd 14A to arrange is executed.

Third, a Cu film 14B of about 0.2 μm thickness is generated by the electroless Cu plating method by using Pd 14A as the catalyst. Here Pd 14A acts as the nucleus and the Cu film 14B is generated on the Al substrate 13A. Then, the Cu film 14B is cleaned by the sulfuric acid and then is plated with the copper sulfate by the electrolytic plating at the atmospheric temperature for 60 minutes. Accordingly, the Cu film 14 of about 20 μm thickness is grown.

According to above steps, the Cu plated film 14 is formed on the outermost surface of the Al substrate to have a film thickness of about 20 μm. Since the Cu plated film 14 can be adhered to the island 15 containing Cu as main material via the brazing solder, the Al substrate can be provided as the radiation substrate 13A that has excellent thermal conduction and seldom generates the particles.

Figure 9:
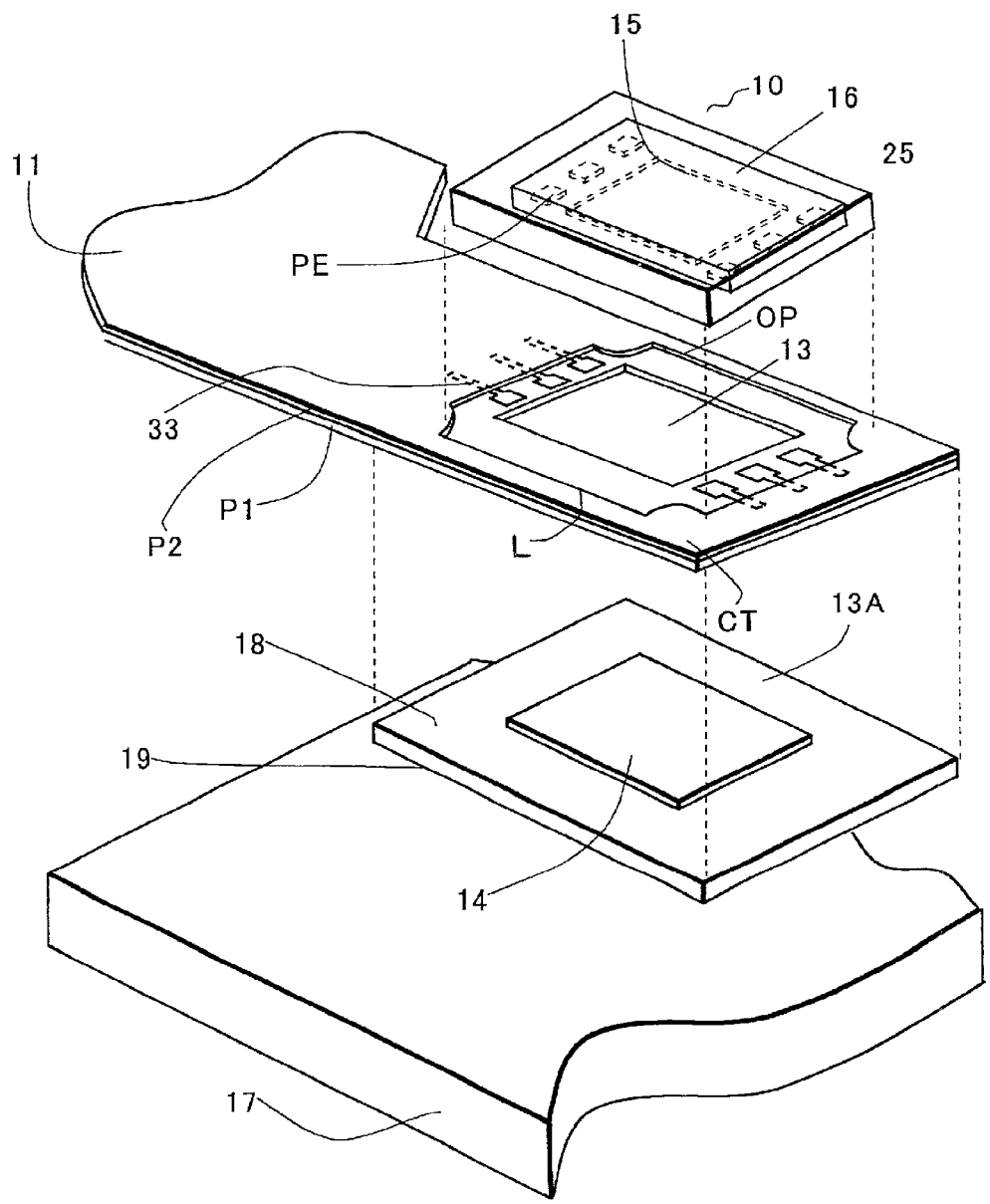
FIG. 9 is a view showing a semiconductor module of the present invention.

Therefore, the semiconductor device can be adhered to a first surface 18, and then a second surface 19 can be brought into contact with the constituent element 17 constituting the electronic equipment, e.g., the inside of the casing, the actuator, and the arm, as shown in FIG. 9.

Also, the first metal film 14 is formed in one area of the Al substrate 13A, and then the oxide film 20 is grown once again in areas other than this one area.

Also, following methods may be employed.

First, Ni or Cu can be plated by the step called the zincate process. At first, after the Al substrate 13A is subjected to the alkaline degreasing and the alkaline etching, the zincate process is applied. This is applied to form the Zn film of about 0.1 to 0.2 μm and then form Cu or Ni by the electroless or electrolytic plating.

Figure 5B:
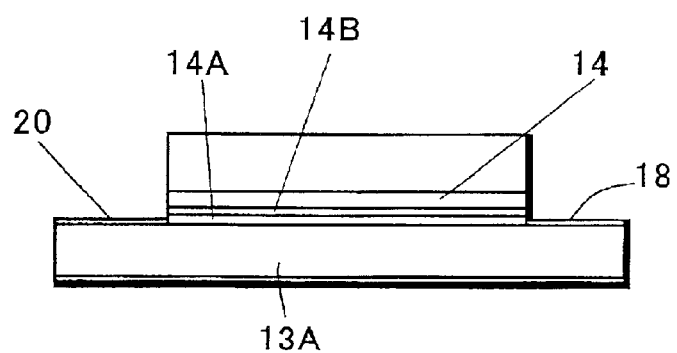
Figure 5C:
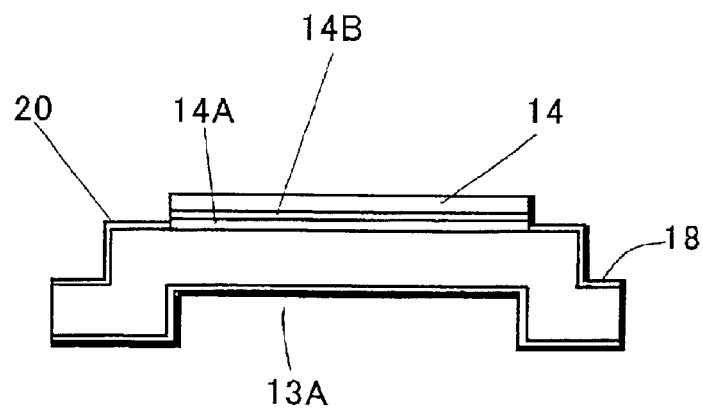

Second, the Al substrate 13A is subjected to the alkaline degreasing and the alkaline etching, then Ni is formed the electroless plating, and then Au is plated. In this manner, if Cu or Au is not directly plated on the Al substrate but Cu or Au is formed after a very thin film (Zn, Pd, etc.) is formed on the Al substrate, a film to which soldering is applicable can be formed on the radiation substrate. In addition, since all films are excellent in thermal conduction, such radiation substrate has the very excellent radiation characteristic. In this case, three type Cu film forming methods are shown herein, but any film forming method may be employed if material to the outermost surface of which the brazing solder, the conductive paste, etc. can be adhered may be coated. FIG. 5B shows the radiation substrate 13A in which the metal plate is adhered onto the first metal film, and FIG. 5C shows the radiation substrate 13A in which the convex shape is formed by the press. If this structure is employed, there is no need to form the back surface of the semiconductor device as the projected shape, as shown in FIG. 7.

[Third Embodiment Explaining the Semiconductor Device]

Figure 1B:
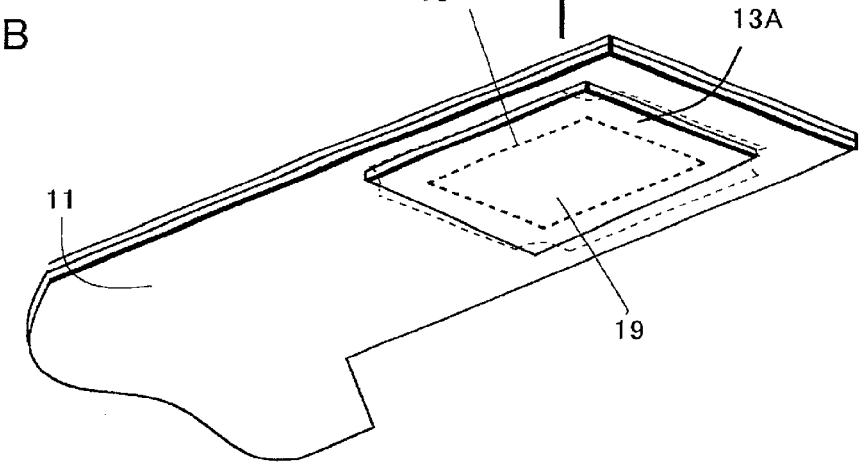

In the semiconductor module shown in FIG. 1, the face-up semiconductor device 10 is mounted onto the flexible sheet 11, and concrete structures of the semiconductor device 10 are shown in FIG. 6 to FIG. 8.

In the semiconductor device 10A shown in FIG. 6, bonding pads (corresponding to the back surface electrode) 21 and the island 15 are arranged substantially on the same surface and the brazing solder 22 shown herein is directly adhered to the radiation substrate 13A or the first metal film 14 formed on the radiation substrate 13A. In the semiconductor device 10B shown in FIG. 7A, the metal plate 23 is adhered to the island 15 via the brazing solder 22 and projected from the back surfaces of the bonding pads 21. In the semiconductor device 10C shown in FIG. 7B, the island 15 is formed integrally with the metal plate 23 and the back surface is also projected rather than the bonding pads 21. In the semiconductor device 10D shown in FIG. 8A, the island 15 is omitted and the back surface of the semiconductor element 16 substantially coincides in level with the back surfaces of the bonding pads 21. Also, in the semiconductor device 10E shown in FIG. 8B, the metal plate 23 is directly adhered to the back surface of the semiconductor element 16 via the brazing solder 22 to project the back surface of the metal plate 23. Finally, in the semiconductor device 10F shown in FIG. 8C, the metal plate 23 is directly adhered to the conductive film 24 formed on the back surface of the semiconductor element 16 to project from the back surfaces of the bonding pads 21.

Figure 6A:
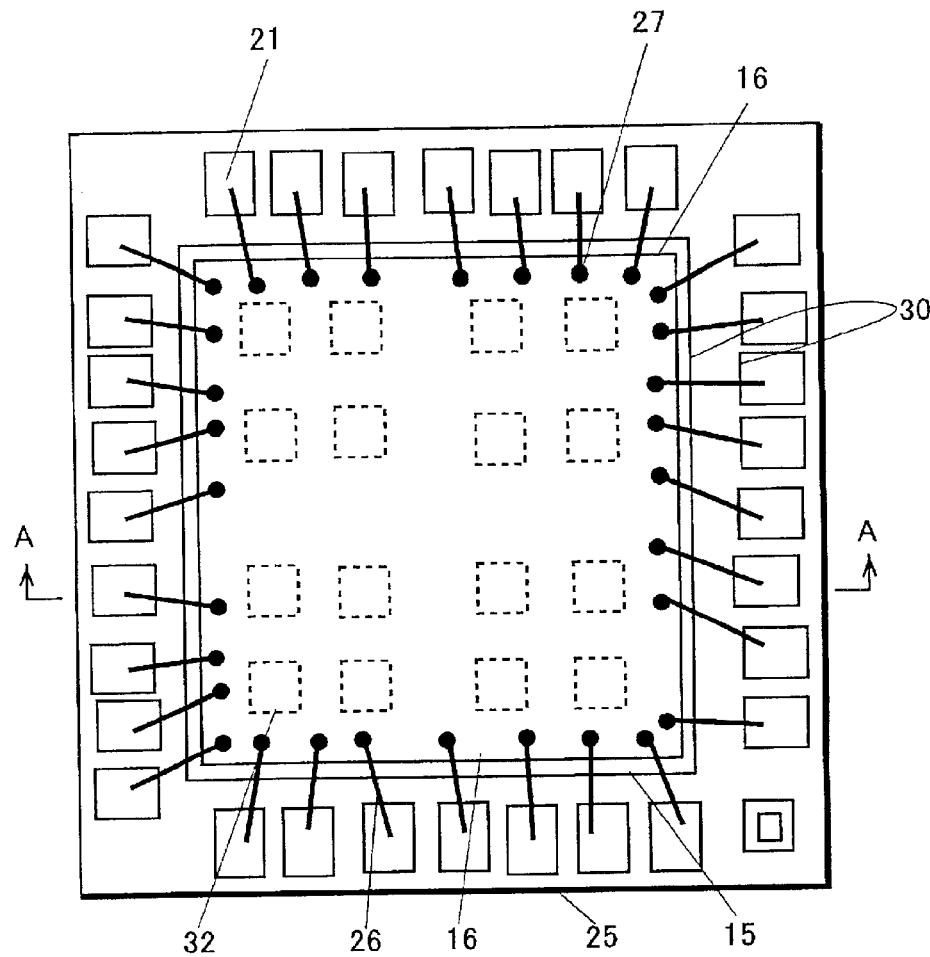
FIGS. 6A and 6B are views showing a semiconductor device of the present invention.
Figure 6B:
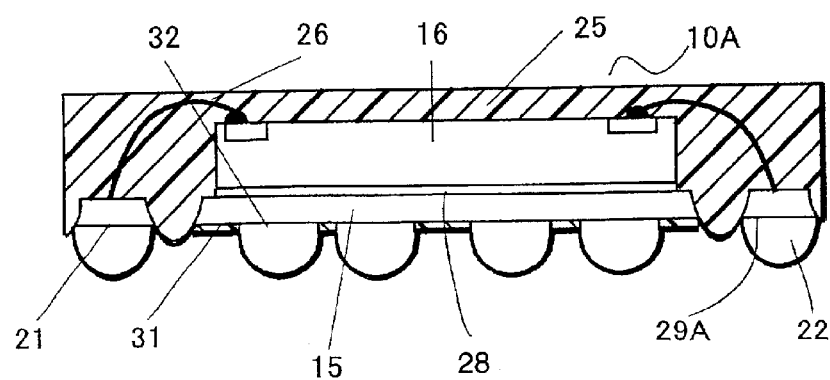

Then, the semiconductor device 10A of the present invention will be explained with reference to FIG. 6 hereunder. FIG. 6A is a plan view of the semiconductor device and FIG. 6B is a sectional view taken along an A-A line.

In FIG. 6, following constituent elements are buried into an insulating resin 25. That is, the bonding pads 21..., the island 15 provided in the region surrounded by the bonding pads 21, and the semiconductor element 16 provided on the island 15 are buried. In this case, since the semiconductor element 16 is mounted in a face-up fashion, the bonding electrodes 27 of the semiconductor element 16 are electrically connected to the bonding pads 21 via the bonding wires 26.

Also, when the island 15 and the semiconductor element 16 are electrically connected to each other, they are adhered by the conductive material. Also, when there is no necessity that the island 15 and the semiconductor element 16 are electrically connected to each other, they are adhered via an insulating adhering means. Since this insulating adhering means causes the thermal resistance, the insulating adhering means in which fillers are mixed to have the small thermal resistance is preferable. Here, Au is coated on the back surface of the semiconductor element, then Ag is formed on the surface of the island, and then both are adhered to each other by the solder 28 (or the Ag paste).

Also, the back surfaces of the bonding pads 21 are exposed from the insulating resin 25, and act as the external connection electrode 29A as they are. Side surfaces of the bonding pads 21 are etched by the non-anisotropic etching. Here, since the side surfaces of the bonding pads 21 are formed by the wet etching, they have a curved structure and thus the anchor effect is generated by such curved structure. In this case, if Al is employed as material, the anisotropic etching may be applied and thus the finer pattern than the case where cu is employed can be formed. In either case, it is preferable that the etching method should be selected from many etching methods to generate the anchor effect on the side surfaces.

The present structure consists of the semiconductor element 16, a plurality of conductive patterns 21, 15, the bonding wires 26, the adhering means 28 between the semiconductor element and the island 15, and the insulating resin 25 for burying them.

As the adhering means 28, the brazing solder such as solder, the conductive past, the adhesive agent formed of conductive material or insulating material, the adhesive insulating sheet are preferable.

As the insulating resin 25, thermosetting resin such as epoxy resin, thermoplastic resin such as polyimide resin, polyphenylene sulfide, etc. can be employed.

Also, if the resin is formed by the mould or the resin may be coated by dipping or coating, any resin may be employed as the insulating resin. Also, as the conductive patterns constituting the bonding pads 21 and the island 15, the conductive leaf containing Cu as major material, the conductive leaf containing Al as major material, the Fe—Ni alloy, the Al—Cu laminated body, the Al—Cu—Al laminated body, etc. maybe employed. Of course, other conductive materials maybe employed. In particular, the conductive material that can be etched and the conductive material that can evaporated by the laser are preferable. Also, in light of the half-etching characteristic, the formability by the plating, the thermal stress, the flexibility, the conductivity, and the thermal conductivity, the conductive material containing the rolling-formed Cu as the major material is preferable.

The present invention has such a feature that, since the insulating resin 25 and the adhering means 28 are also filled in a separating groove 30, omission of the conductive pattern can be prevented. Also, the side surfaces of the bonding pads 21 are formed as the curved structure by applying the non-unisotropic etching by employing the dry etching or the wet etching as the etching to generate the anchor effect. As a result, the structure can be achieved in which the conductive patterns 15, 21 do not come out from the insulating resin 25.

In addition, the back surface of the island 15 is exposed from the back surface of the package. Accordingly, the back surface of the island 15 can be brought into contact with or be adhered to the metal plate 23 shown in FIG. 7A, the second supporting member (radiation substrate) 13A shown in FIG. 1, or can be brought into contact with or be adhered to the first metal film 14 coated on the second supporting member 13A. According to this structure, the heat generated from the semiconductor element 16 can be radiated and thus the increase in temperature of the semiconductor element 16 can be prevented. As a result, the driving current and the driving frequency of the semiconductor element 16 can be increased. The reason for using the expression of "contact" is that the adhering means such as the solder, etc. can come into contact with the Al substrate on the surface of which only the oxide film is formed.

Also, in the semiconductor device 10A, since the bonding pads 21 and the island 15 are supported by the insulating resin 25 as the sealing resin, the supporting substrate is omitted. This configuration is a feature of the present invention. Since the conduction paths of the semiconductor device in the prior art are supported by the supporting substrate (the flexible sheet, the printed circuit board, or the ceramic substrate) or the lead frame, the configurations that may be essentially omitted are added. However, since the present circuit device is constructed by the necessary and lowest minimum constituent elements so as to omit the supporting substrate, the reduction in size and weight can be achieved and also a material cost can be suppressed. Therefore, the semiconductor device 10A becomes inexpensive in cost.

Also, the bonding pad 21 and the island 15 are exposed from the back surface of the package. If the brazing solder such as solder, etc. is coated on this area, the island 15 gets wet in the brazing solder with a different thickness because the island 15 has a wide area. Therefore, in order to make the film thickness of the brazing solder uniform, an insulating film 31 is formed on the back surface of the semiconductor device 10A. A rectangular dotted line 32 in FIG. 6A indicates an exposed area exposed from the insulating film 31. Here, since the back surfaces of the bonding pads 21 are exposed as a rectangular shape, the same sizes as those shapes are exposed from the insulating film 31. In this case, it is needless to say that various shapes such as the circle, the ellipse, etc. maybe selected as the shape.

Accordingly, since the areas wetted by the brazing solder have substantially the same size, the thickness of the brazing solder formed here becomes substantially equal. This is true after the solder print or the solder reflow. It is possible to say that this is true of the conductive paste such as Ag, Au, Ag—Pd, etc. According to this structure, it can be calculated with good precision how much the back surface of the metal plate 23 described later is projected from the back surface of the bonding pads 21. Also, as shown in FIG. 6B, if the solder balls 22 are formed, the failure in soldering can be eliminated since bottom ends of all solder balls come into contact with the conduction paths of the flexible sheet.

Also, the exposed areas 32 of the island 15 maybe formed larger than the exposed size of the bonding pads 21 by taking account of the heat radiation of the semiconductor element, otherwise the entire area of the island 15 may be exposed from the insulating film 31. In this case, it is possible to omit the coating of the insulating film 31.

Also, the conductive pattern 33 provided on the first supporting member (flexible sheet) 11 can be extended to the back surface of the semiconductor device 10A as it is by providing the insulating film 31. In general, the conductive pattern 33 provided on the first supporting member (flexible sheet) 11 side is arranged to detour the adhering area of the semiconductor device, but such conductive pattern 33 can be arranged without the detour because of formation of the insulating film 31. In addition, since the insulating resin 25 is projected from the conductive pattern, the clearance can be formed between the wirings 33 on the first supporting member (flexible sheet) 11 and the conductive pattern 21, 15. Thus, merits such as prevention of the short-circuit, facilitation of the cleaning, etc. can be achieved.

[Fourth Embodiment Explaining the Semiconductor Device]

Figure 7A:
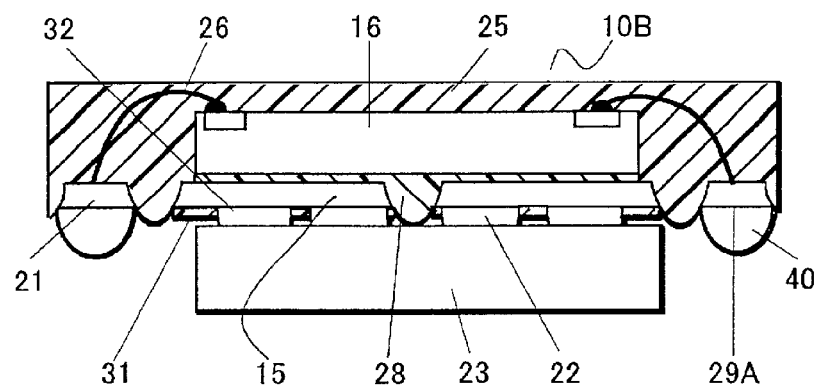
FIGS. 7A and 7B are views showing a semiconductor device of the present invention.

The semiconductor device 10B shown in FIG. 7A corresponds the semiconductor device 10A shown in FIG. 6 to which the metal plate 23 is adhered. Accordingly, since elements other than the metal plate 23 are substantially similar to FIG. 6, different elements will be explained.

A reference 28 is the adhering means, and is projected from the bonding pads 21 and the island 15, as can be seen from the manufacturing method described later. Then, an amount of projection of the back surface of the metal plate 23 can be simply adjusted by a thickness of the metal plate 23. For example, if the metal plate 23 is pushed against the adhering means 28 when the brazing solder 22 is melted, the thickness of the solder between the metal plate 23 and the island 15 can be decided based on an amount of projection of the adhering means 28.

Therefore, if the thickness of the metal plate 23 is decided, it can be calculated how long the back surface of the metal plate 23 is projected from the back surface of the external connection electrode 29A (or the lowermost end of the solder balls 40).

Accordingly, as shown in FIG. 1A, if the surface of the radiation substrate 13A is positioned lower than the mounting surface of the first supporting member (flexible sheet) 11, the back surface of the metal plate 23 can be brought into contact with the radiation substrate 13A by forming the radiation substrate 13A after the amount of projection is calculated precisely.

[Fifth Embodiment Explaining the Semiconductor Device]

Figure 7B:
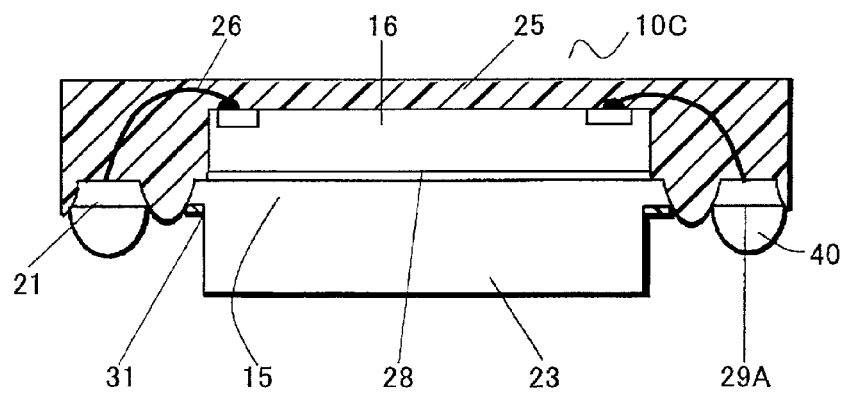

Then, FIG. 7B will be explained hereunder. In this semiconductor device 10C, the island 15 and the metal plate 23 are formed integrally. This manufacturing method will be explained later with reference to FIG. 21 to FIG. 23.

Since the island 15 and the metal plate 23 can be worked from the same conductive leaf by etching, there is no necessity to stick the metal plate 23, unlike FIG. 7A. If an amount of etching is controlled, it can be controlled with good precision how long the back surface of the metal plate 23 is projected from the back surface of the bonding pads 21 (or the lowermost end of the solder balls 40). Accordingly, like FIG. 7A, if the surface of the radiation substrate 13A is formed lower than the mounting surface of the first supporting member (flexible sheet) 11, the back surface of the metal plate 23 can be brought into contact with the radiation substrate 13A by forming the radiation substrate 13A after the amount of projection is calculated precisely.

[Sixth Embodiment Explaining the Semiconductor Device]

Figure 8A:
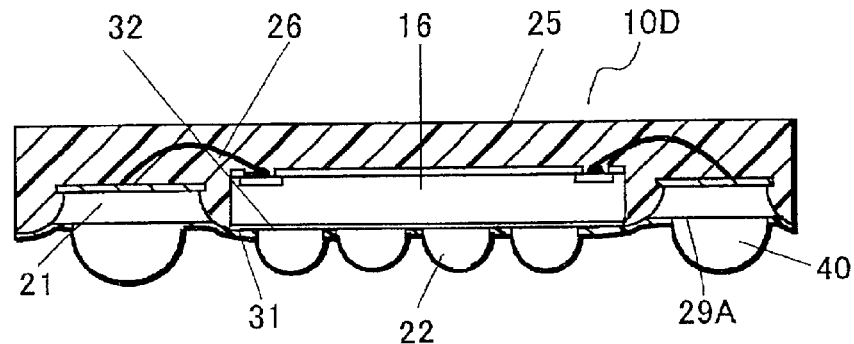
FIGS. 8A to 8C are views showing a semiconductor device of the present invention.

In the semiconductor device 10D shown in FIG. 8A, the island 15 shown in FIG. 6, FIG. 7 is omitted. If the area acting as the island 15 is also omitted in steps in FIG. 17, the back surface of the semiconductor element 16 is exposed from the insulating resin 25, and thus the back surface of the semiconductor element 16 and the back surfaces of the bonding pads 21 are substantially at the same surface level.

In this case, the surface of the semiconductor element 16 can be positioned lower than the surface of the semiconductor element 16 shown in FIG. 6, FIG. 7. Therefore, this semiconductor device has such a feature that, since the uppermost portions of the bonding wires 26 can be positioned on the lower side, the thickness of the insulating resin 25 can be reduced correspondingly and thus the overall size can be formed thin.

Since this semiconductor device is similar to that in FIG. 6 except this feature, following explanation will be omitted.

[Seventh Embodiment Explaining the Semiconductor Device]

Figure 8B:
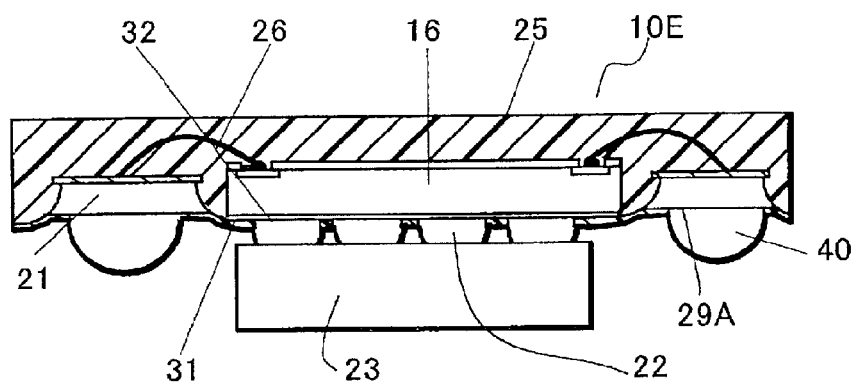

The semiconductor device 10E in FIG. 8B corresponds to the semiconductor device in FIG. 8A to which the metal plate 23 is attached. The reason for attaching the metal plate 23 is identical to that in FIG. 7A, i.e., to project the back surface of the metal plate 23 rather than the back surfaces of the bonding pads 21. If the radiation substrate 13A with which the semiconductor device 10E is brought into contact is arranged lower than the back surface of the bonding pads 21 (or lower ends of the solder balls 40), the semiconductor device 10E can contact to the radiation substrate 13A via the metal plate 23 acting as the projection.

[Eighth Embodiment Explaining the Semiconductor Device]

Figure 8C:
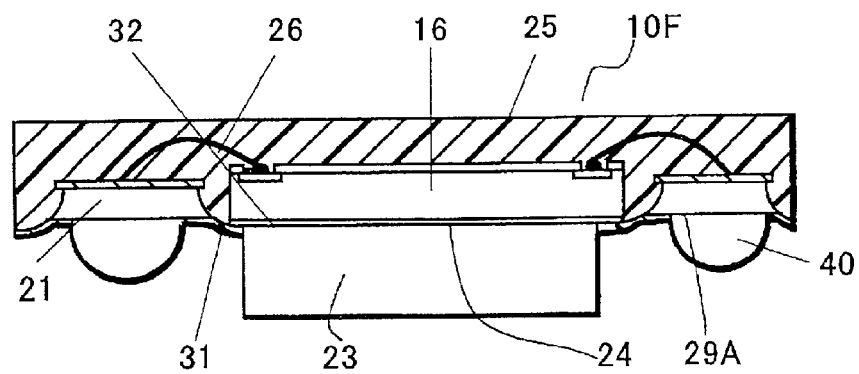
Figure 21:
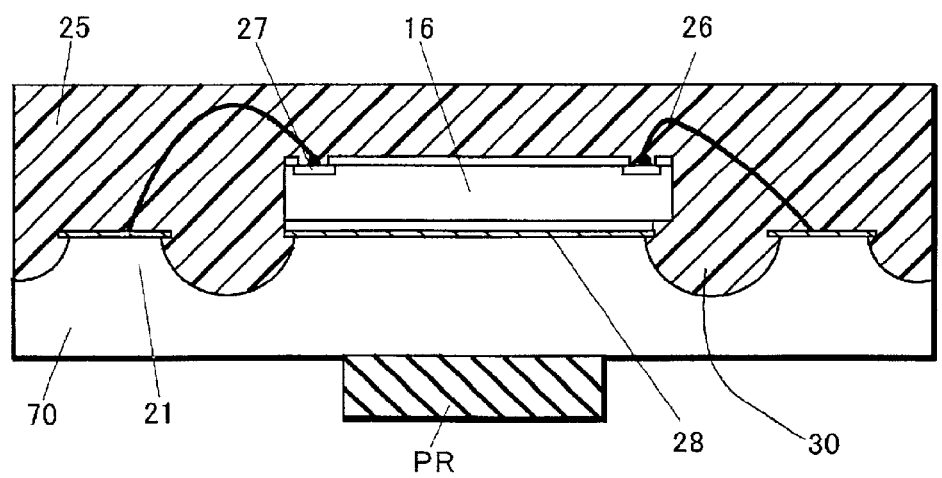
FIG. 21 is a view showing a method of manufacturing a semiconductor device of the present invention.
Figure 22:
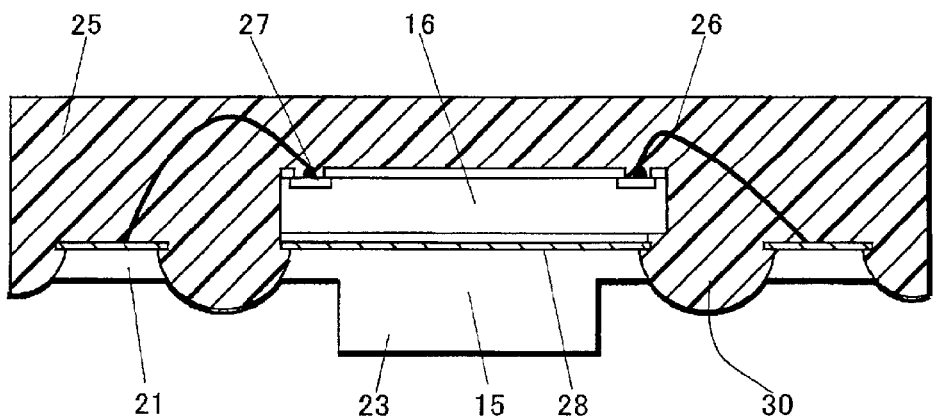
FIG. 22 is a view showing a method of manufacturing a semiconductor device of the present invention.

The semiconductor device 10F in FIG. 8C can be formed by half-etching an area acting as the island 15 and then adhering the back surface of the semiconductor element 16 to the separating groove in the manufacturing method in FIG. 21, and projecting the conductive leaf 70, that is positioned on the back surface of the semiconductor element 16, to the back surface side in steps in FIG. 22. If the radiation substrate 13A with which the semiconductor device 10F is brought into contact is arranged lower than the back surface of the bonding pads 21 (or the lower ends of the solder balls 40), the semiconductor device 10F can contact to the radiation substrate 13A via the metal plate 23 acting as the projection.

The semiconductor device, in which the face up type semiconductor element explained above in FIG. 6 to FIG. 8C is built, is electrically connected to the conductive pattern 33 on the first supporting member (flexible sheet) 11 like FIG. 1, and simultaneously the island of the semiconductor device is adhered to the first metal film 14 formed on the second supporting member 13A. Also, the metal plate 23 formed on the back surface of the semiconductor device is adhered to the first metal film 14 formed on the second supporting member 13A. Especially, since the first metal film 14 consists of the film containing Cu as major material, the film containing Au as major material, or the film containing Ag as major material, the balls 22 made of brazing solder such as solder, etc. can be adhered to the first metal film 14 in FIG. 6, FIG. 8A and also the metal plate 23 can be adhered to the first metal film 14 via the brazing solder or the conductive paste in FIG. 7A, FIG. 7B, FIG. 8B, FIG. 8C.

In this case, if the Al substrate on the surface of which the oxide film is formed is used as the radiation substrate, the balls may be melted and brought into contact.

As a result, since the back surface of the semiconductor element 16 is satisfactorily thermally coupled with the radiation substrate 13A, the heat generated from the semiconductor element can be radiated from the radiation substrate 13A to the metal member constituting an electronic equipment. Thus, the driving ability of the semiconductor element can be improved.

In addition, features of the present invention will be explained in detail. The flexible sheet 11 is made of sheets which are formed of insulating material such as polyimide, etc. to sandwich the conductive pattern. In some cases, the multi-layered structure maybe employed. For the convenience of explanation, the flexible sheet having a single layer wiring will be explained herein. Pad electrodes PD are exposed, and two opening portions are provided on the inside of the pad electrodes PD to expose the radiation substrate 13A.

The flexible sheet 11 in FIG. 1 mainly consists of a first insulating sheet P1, the conductive pattern 33, and a second insulating sheet P2. The first insulating sheet P1, to which the conductive pattern 33 is adhered via the adhesive, functions as the supporting substrate. The second insulating sheet P2 functions as the protection film of the conductive pattern 33. The adhesive is provided between the conductive pattern 33 and the second insulating sheet P2. Then, the first opening portion OP is formed in the second insulating sheet P2 to expose the pad electrodes PD. The second opening portion 13 is formed in the first insulating sheet P1 to expose the surface of the radiation substrate 13A. The first opening portion OP must be opened wider than the second opening portion 13 to expose the pad electrodes PD. The second opening portion 13 has a size which can expose the island 15 or a size which can expose the metal plate 23.

A feature of the present invention resides in that the contact area CT, with which the back surface of the semiconductor device, particularly the insulating resin 25 comes into contact, is formed in the first opening portion OP and simultaneously at least one side L is arranged on the outer side than the arranging area of the semiconductor device 10.

Figure 2A:
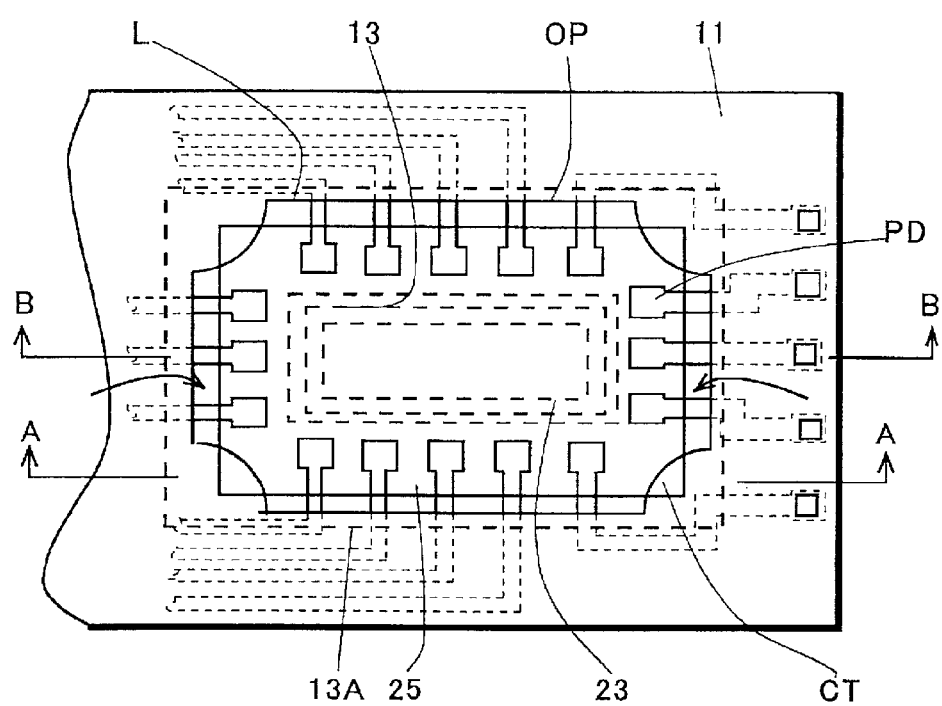
FIGS. 2A to 2C are enlarged views showing an pertinent portion in FIG. 1.
Figure 2B:
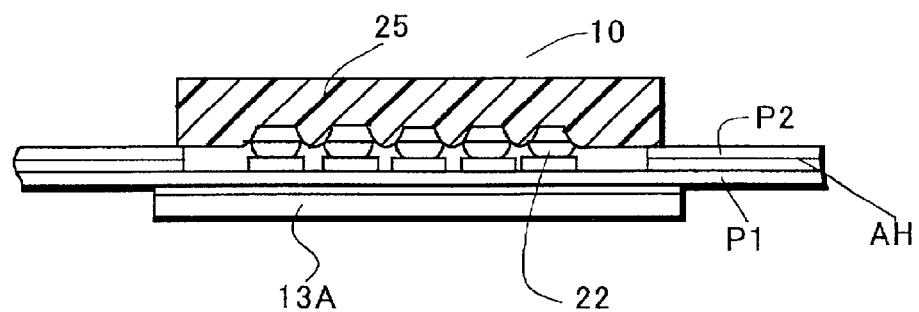
Figure 2C:
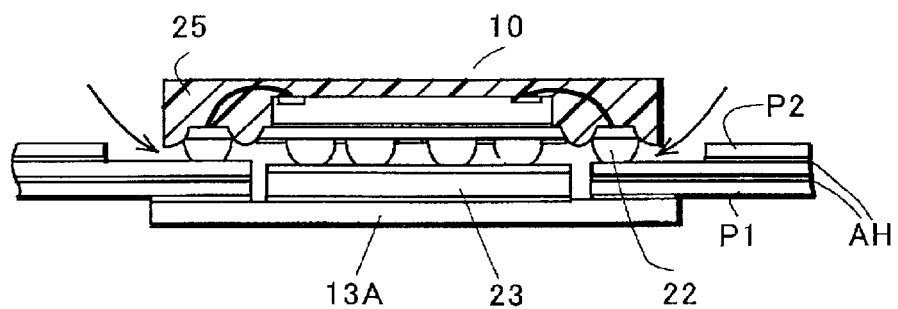

An enlarged view of this portion is shown in FIG. 2. FIG. 2A is a plan view, FIG. 2B is a sectional view taken along an A-A line, and FIG. 2C is a sectional view taken along an B-B line.

This structure makes it possible to increase the adhering strength by assuring the thickness of the solder balls 22 of the semiconductor device 10 and also clean the back surface of the semiconductor device 10.

First, in order to hold the thickness of about 40 to 60 $\mu$m by the second insulating sheet P2 and the adhesive AH in total, inventors of the present invention brings the back surface of the insulating resin 25 into contact with the first insulating sheet P1 to assure the thickness of the solder 22. However, since the entire periphery of the back surface of the semiconductor device 10 comes into contact with the first insulating sheet P1, it is impossible to execute the cleaning of the back surface of the semiconductor device 10.

Therefore, as shown in FIG. 2A and FIG. 2C, if the first opening portion OP other than the contact area CT is positioned on the outer side than the arranging area of the semiconductor device 10, the cleaning liquid can enter from a portion indicated by an arrow. This structure is suitable for the filling of underfill material to prevent the degradation and the disconnection of the solder.

For example, the impurity such as the flux, etc. is generated in the clearance between the semiconductor device 10 and the flexible sheet after the back surface electrodes PE and the pad electrodes PD are connected via the solder balls 22. At this time, the clearance can be cleaned via the opening portion indicated by the arrow. In addition, since the underfill material can be injected, the adhering strength of the solder 22 and the reliability can be improved.

Figure 3:
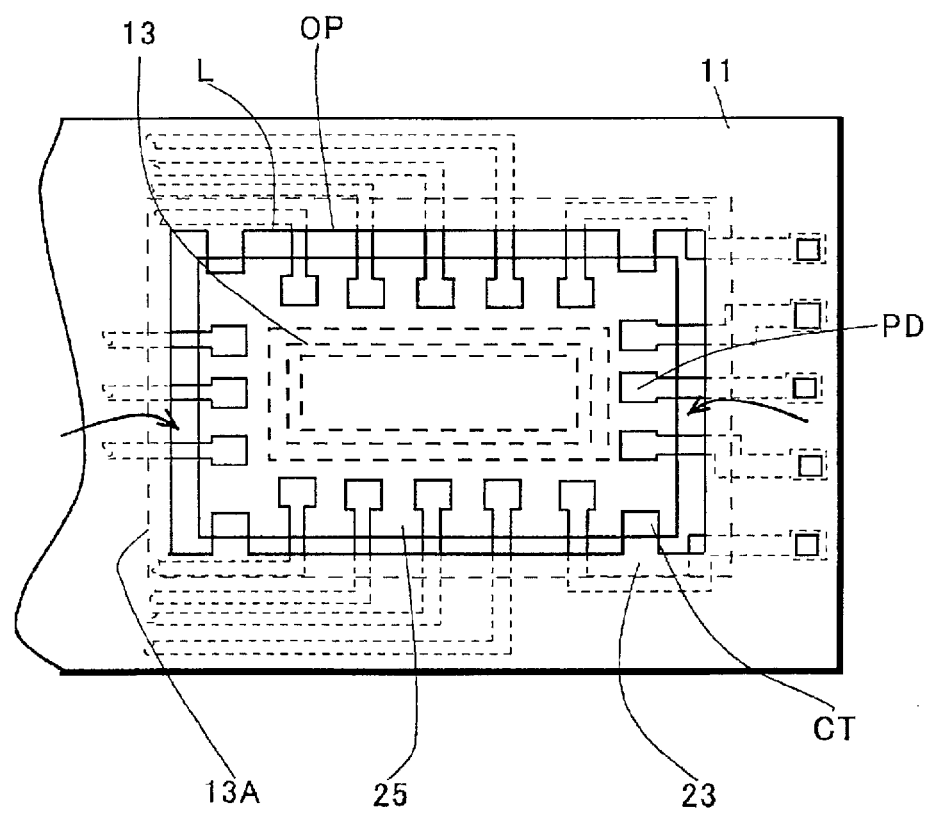
FIG. 3 is a view showing a variation of FIG. 2.

FIG. 3 shows a variation of the contact area CT. In FIG. 2, the contact area CT that has a quadrant at a corner portion of the first opening portion OP respectively is formed. In FIG. 3, the projection portion CT which enables to contact to the back surface of the insulating resin 25 from four sides of the first opening portion OP is provided.

FIG. 4 shows another variation of the contact area CT. Here, spacers SP are arranged as the contacting means on the back surface of the semiconductor device 10. Such spacers can be formed by various methods.

Figure 4A:
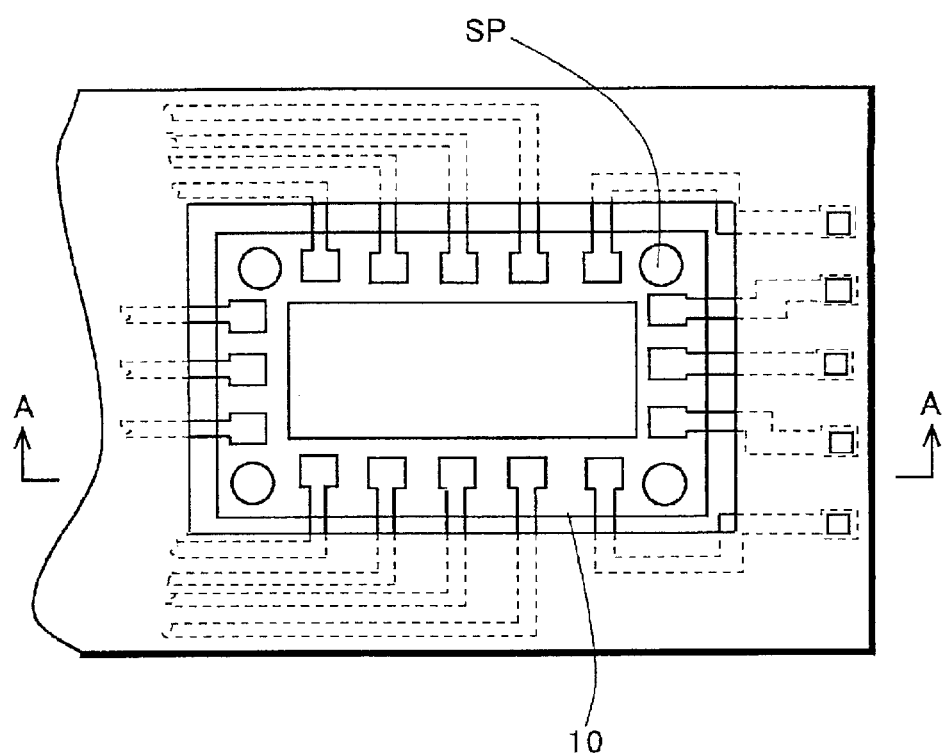
FIGS. 4A to 4D are views showing another variation of FIG. 2.
Figure 4B:
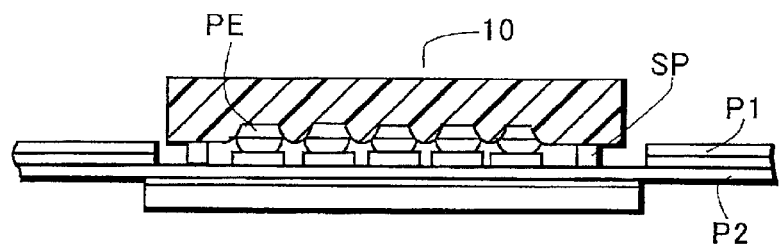
Figure 4C:
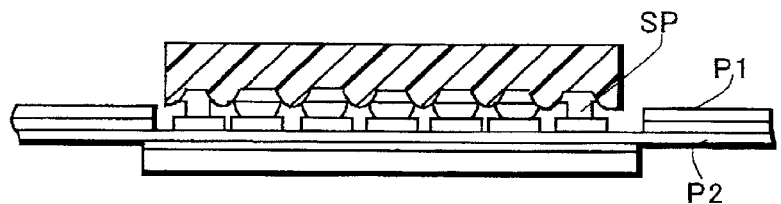
Figure 4D:
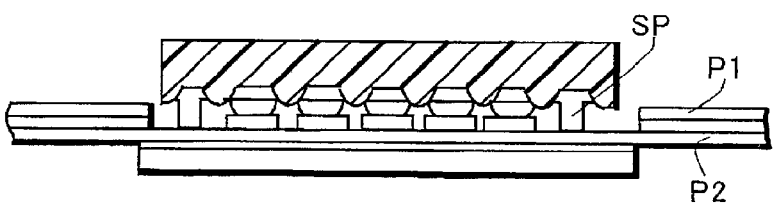

First of all, as shown in FIG. 4A, the spacers are adhered to the flexible sheet or the back surface of the semiconductor device. Here, the first insulating sheet P1 is left like the island to form the spacers SP. FIG. 4C and FIG. 4D show spacers which are formed simultaneously when the back surface electrodes PE are formed. If the electrodes are formed to project rather than the back surface electrodes PE, they can function as the spacer. In FIG. 4C, the spacers come into contact with the pad electrodes PD formed on the flexible sheet. In FIG. 4D, the spacers come into contact with the bottom surface of the opening portion, i.e., the first insulating sheet P1 or the insulating adhesive provided on the first insulating sheet P1.

At least three contact areas CT or the spacers SP should be formed. This is true of all semiconductor modules.

Then, the semiconductor module that is slightly different from the semiconductor module shown in FIG. 1 is shown in FIG. 9. This module employs the face down semiconductor element 16 as shown in FIG. 10 to FIG. 12. In this case, since the module is almost similar except using the face down semiconductor element 16, only simple explanation will be given. Also, since the radiation substrate employed as the second supporting member 13A is identical to that in the second embodiment, its explanation will be omitted.

In FIG. 9, the semiconductor element 16 is mounted in a face-down fashion, and the back surface electrodes PE and the bonding electrodes 27 of the semiconductor element 16 are connected together via the brazing solder such as solder, etc. or bump electrodes. Therefore, the thickness of the package can be reduced thinner than the structure employing the bonding wires 26 in FIG. 6. But the back surface of the semiconductor element 16 is thermally coupled with the island 15 in FIG. 6 whereas the semiconductor element 16 described herein is inferior in thermal resistance since such semiconductor element 16 is adhered by the insulating adhering means 50. However, this thermal resistance can be reduced by mixing fillers into the insulating adhering means 50. In addition, there is such a merit that impedances of the bonding electrodes 27 and the back surface electrodes 21 can be set lower than that of the face-up semiconductor element because of the shorter path.

[Ninth Embodiment Explaining the Semiconductor Device]

Figure 10A:
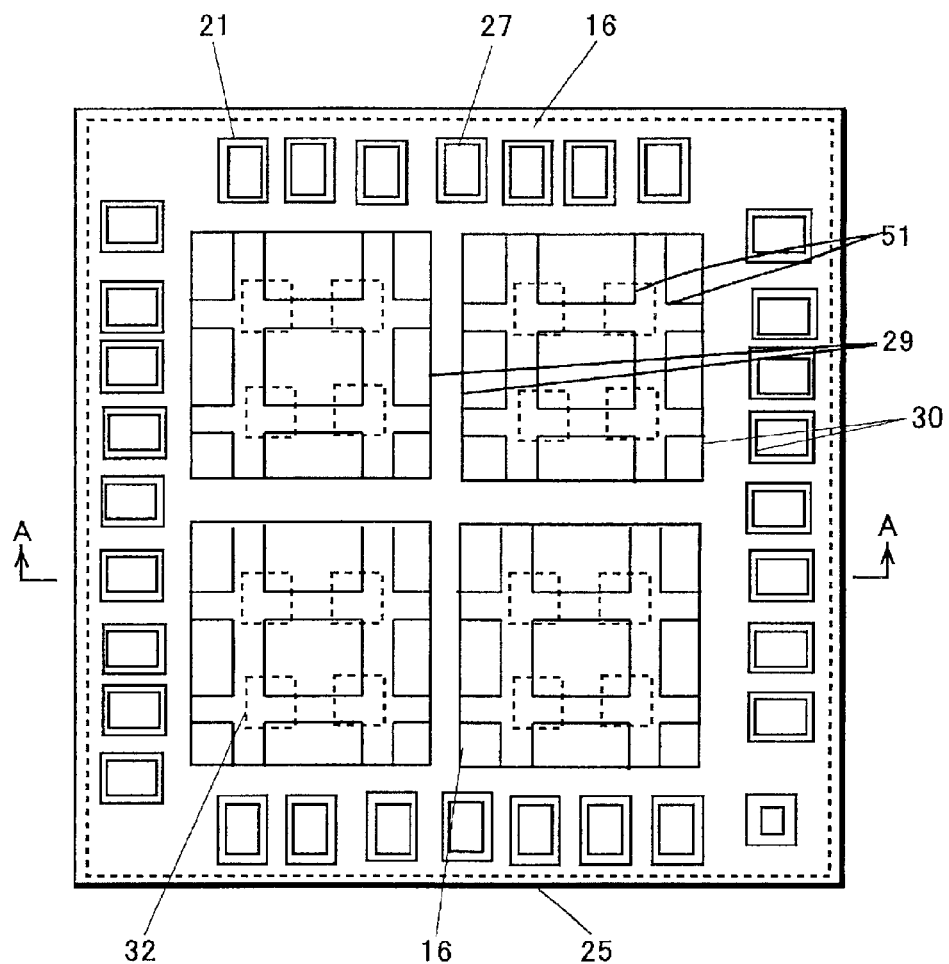
FIGS. 10A and 10B are views showing a semiconductor device of the present invention.
Figure 10B:
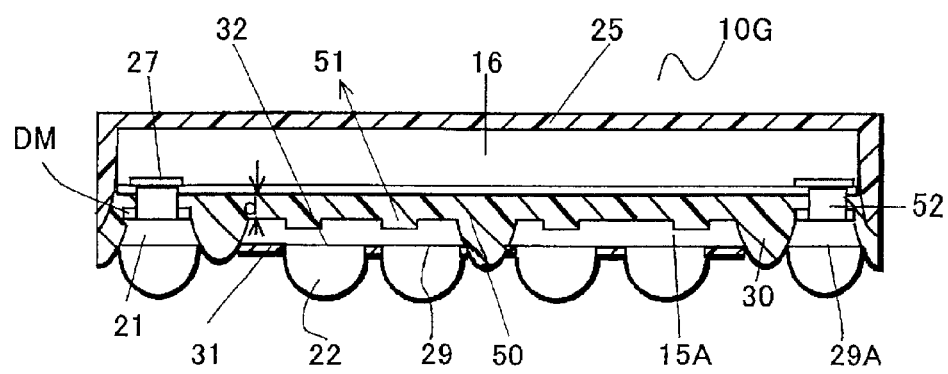

First, the semiconductor device of the present invention will be explained with reference to FIG. 10. FIG. 10A is a plan view of the semiconductor device, and FIG. 10B is a sectional view taken along an A-A line.

In FIG. 10, following constituent elements are buried in the insulating resin 25. That is, the back surface electrodes 21, the radiation electrode 15A provided in the area surrounded by the back surface electrodes 21, and the semiconductor element 16 provided on the radiation electrode 15A are buried. In this case, the radiation electrode 15A corresponds to the island 15 in FIG. 6. However, since the semiconductor element 16 is mounted in a face-down fashion, it can be adhered to the radiation electrode 15A via the insulating adhering means 50. The radiation electrode 15A is divided into four areas in view of the adhesiveness. A separating groove formed by this four division is indicated by a reference 29. A reference 30 denotes a separating groove formed between the back surface electrodes 21 and the radiation electrodes 15A. Also, the radiation electrode 15A are not divided into plural pieces and, as shown in FIG. 6, may be formed as a single electrode.

Also, if the clearance between the semiconductor element 16 and the radiation electrodes 15A is narrow and thus the insulating adhering means 50 is hard to enter into the clearance, grooves, as indicated by 51, that are shallower in depth than the separating grooves 29, 30 may be formed on the surface of the radiation electrode 15A.

Also, the bonding electrodes 27 of the semiconductor element 16 and the back surface electrodes 21 are electrically connected to each other via the brazing solder such as solder, etc. Stud bumps such as Au, etc. may be employed in place of the solder. For example, the bumps are provided to the bonding electrodes 27 of the semiconductor element 16 and then the bumps may be connected by the ultrasonic wave or the welding with pressure. Also, reduction in the connection resistance and improvement of the adhering strength may be achieved by providing the solder, the conductive paste, or the anisotropic conductive particles in the peripheries of the pressure-welded bumps.

Also, the back surfaces of the pads 21 are exposed from the insulating resin 25 and acts as the external connection electrode 29A as it is. The side surfaces of the back surface electrodes 21 are etched by the non-unisotropic etching. Here, the side surfaces have a curved structure since they are formed by the wet etching, the anchor effect is generated by the curved structure.

Also, in the arranging area of the semiconductor element 16, the insulating adhering means 50 is formed on the radiation electrode 15A, on the back surface electrodes 21 and between them. Especially, the insulating adhering means 50 is provided in the separating grooves 29 formed by the etching and the back surface of the insulating adhering means is exposed from the back surface of the semiconductor device 10G. Also, all the elements including them are sealed by the insulating resin 25. Then, the back surface electrodes 21 . . . , the radiation electrode 15A, and the semiconductor element 16 are supported by the insulating resin 25 and the insulating adhering means 50.

The adhesive formed of insulating material, or underfill material having high osmosis are preferable as the insulating adhering means 50. In the case of the adhesive, such adhesive is coated previously on the surface of the semiconductor element 16 and then semiconductor element 16 is adhered by the pressure welding when the back surface electrodes 21 are connected by using the Au bumps instead of the solder 52. In the case of the underfill material, such underfill material may penetrate into the clearance after the solder 52 (or the bumps) and the back surface electrodes 21 are connected to each other.

Since the insulating resin and the conductive pattern are similar to the above embodiments, their explanation will be omitted.

In the present invention, like the above embodiment, since the insulating resin 25 and the insulating adhering means 50 are filled in the separating grooves 29, the coming-off of the conductive pattern can be prevented. Also, the side surfaces of the conductive patterns can be formed as the curved structure to generate the anchor effect. As a result, the structure in which the back surface electrodes 21 and the radiation electrode 15A are not come out from the insulating resin 25 can be implemented.

Also, the back surface of the radiation electrode 15A is exposed from the back surface of the package. Hence, the back surface of the radiation electrode 15A can be adhered to the second supporting member 13A or the first metal film 14 on the second supporting member 13A via the solder or the conductive paste. According to this structure, the heat generated from the semiconductor element 16 can be radiated and thus the increase in temperature of the semiconductor element 16 can be prevented. As a result, the driving current and the driving frequency of the semiconductor element 16 can be increased correspondingly.

Like the above embodiment, the semiconductor device 10G of the present invention does not need the supporting substrate, the reduction in size and weight can be achieved. Thus, the semiconductor device can be packed in the arm or the suspension of the hard disk.

Also, since the exposed areas 32 exposed from the insulating film 31 are set substantially equal in level to the back surfaces of the back surface electrodes 21, the thickness of the formed brazing solder become substantially equal.

[Tenth Embodiment Explaining the Semiconductor Device 10H]

Figure 11A:
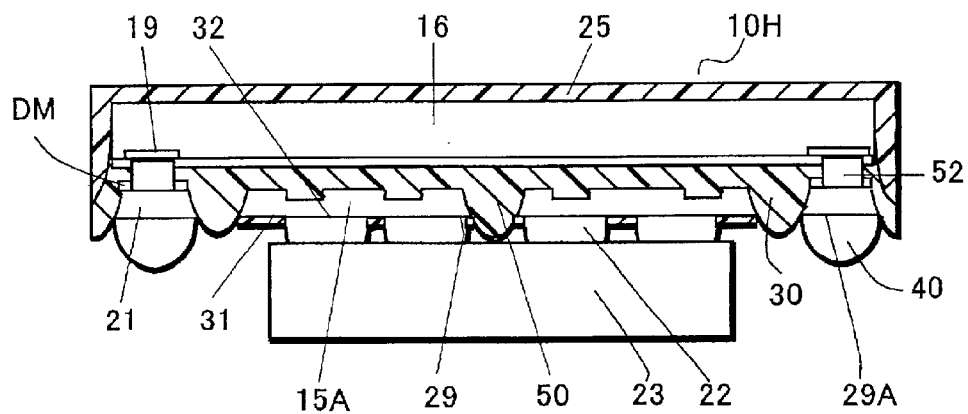
FIGS. 11A and 11B are views showing a semiconductor device of the present invention.

A sectional view of the semiconductor device 10H is shown in FIG. 11A. A cutting direction corresponds to an A-A line in FIG. 10. In this case, the semiconductor device 10H is constructed by attaching the metal plate 23 to the structure in FIG. 10. Now, different portions will be explained herein.

A reference 50 is the insulating adhering means. As can be seen from the manufacturing method described later, the insulating adhering means is projected from the back surface electrodes 21 and the radiation electrode 15A. Accordingly, if an amount of projection of the metal plate 23 must be controlled with high precision, the thickness of the solder between the radiation electrode 15A and the metal plate 23 can be maintained constant by pushing the metal plate 23 against the convex portion of the insulating adhering means 50 when the brazing solder 22 is melted.

Accordingly, if the thickness of the metal plate 23 is decided, it can be calculated how long the back surface of the metal plate 23 is projected from the back surface of the back surface electrodes 21 (or the lowermost ends of the solder balls 40).

Therefore, as shown in FIG. 9, if the surface of the radiation substrate 13A is formed lower than the mounting surface of the first supporting member 11, the back surface of the metal plate 23 can be brought into contact with or be adhered to the radiation substrate 13A by forming the radiation substrate 13A after the amount of the projection is calculated precisely.

[Eleventh Embodiment Explaining the Semiconductor Device 10I]

Figure 11B:
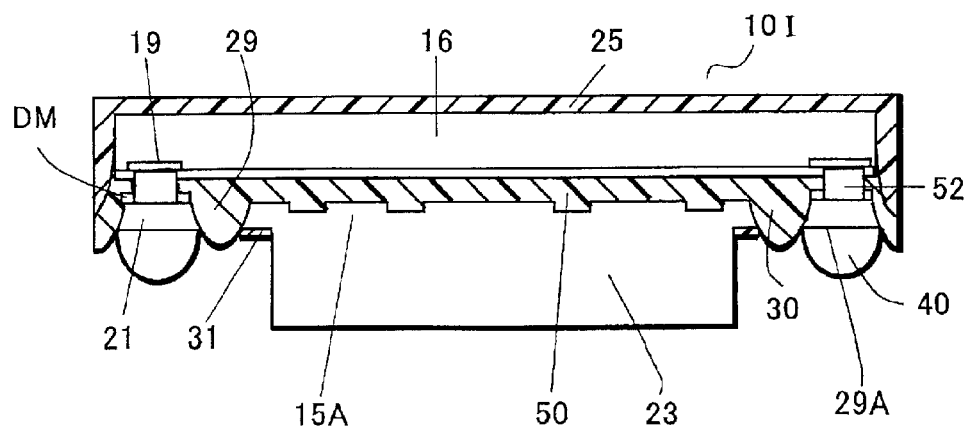

Then, FIG. 11B will be explained. In the semiconductor device 10I, the radiation electrode 15A and the metal plate 23 are formed integrally. In this case, the manufacturing method will be described later in FIG. 21 to FIG. 23.

The radiation electrode 15A and the metal plate 23 are worked from the same conductive leaf by etching. Hence, contrary to FIG. 11A, it is possible to eliminate the necessity to stick the metal plate 23. If an amount of etching is controlled, it can be controlled with good precision how long the back surface of the metal plate 23 is projected from the back surface of the back surface electrodes 21 (or the lower ends of the solder balls 40). Accordingly, like FIG. 7B, if the surface of the radiation substrate 13A is formed lower than the mounting surface of the first supporting member 11, the back surface of the metal plate 23 can be brought into contact with or be adhered to the radiation substrate 13A by forming the radiation substrate 13A after the amount of projection is calculated precisely.

Then, three semiconductor devices shown in FIG. 12 will be slightly explained hereunder. Three semiconductor devices 10J to 10L have a structure substantially identical to the semiconductor devices shown in FIG. 10 and FIG. 11. A difference is that the surface of the radiation electrode 15A is arranged higher than the surfaces of the back surface electrodes 21. Accordingly, a predetermined interval is provided between the bonding electrodes 27 and the back surface electrodes 21.

[Twelfth Embodiment Explaining the Semiconductor Device 10J]

Figure 12A:
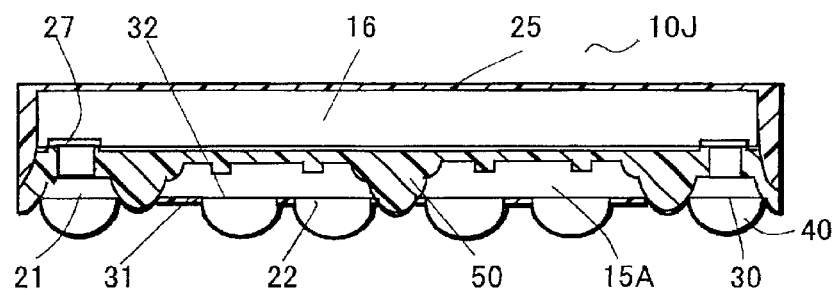
FIGS. 12A to 12C are views showing a semiconductor device of the present invention.

The semiconductor device 10J shown in FIG. 12A is substantially identical to FIG. 10. A difference is that the surface of the radiation electrode 15A is arranged higher than the surfaces of the back surface electrodes 21. Here, this difference will be explained.

The present invention has such a feature that the surface of the radiation electrode 15A is projected in contrast to the surfaces of the back surface electrodes 21.

As the means for connecting the back surface electrode 21 and the bonding electrode 27, there may be considered the Au bump, the solder ball, etc. At least one stage of Au mass is formed as the Au bump, and the thickness of one stage is about 40 $\mu$m and thickness of two stages is about 70 to 80 $\mu$m. In general, as shown in FIG. 10B, since the surface of the radiation electrode 15A and the surfaces of the back surface electrodes 21 coincide in height with each other, the clearance d between the semiconductor element 16 and the radiation electrode 15A can be substantially decided by the thickness of the bump. Accordingly, in the case of FIG. 10B, the clearance d cannot be reduced further more, so that the thermal resistance generated by the clearance cannot be reduced. However, as shown in FIG. 12A, if the surface of the radiation electrode 15A is projected rather than the surfaces of the back surface electrodes 21 to an extent of almost the thickness of the bump, this clearance d can be reduced extremely. Thus, the thermal resistance of the semiconductor element 16 and the radiation electrode 15A can be lowered.

Also, the thickness of the solder bump or the solder ball is about 50 to 70 $\mu$m. The clearance d can be reduced in the same way. In addition, since the brazing solder such as the solder has good wettability for the back surface electrodes 21, such brazing solder can spread over the entire area of the back surface electrodes 21 when it is melted, and thus the thickness become thin. However, since the clearance d between the bonding electrode 27 and the back surface electrodes 21 is decided by the amount of projection of the radiation electrode 15A, the thickness of the brazing solder can be decided by this amount of projection and thus above flow of the solder can be prevented. Accordingly, the stress applied to the solder can be scattered because the thickness of the brazing solder can be formed thick, and thus the degradation due to heat cycle can be suppressed. Also, the cleaning liquid can enter into this clearance by adjusting this amount of projection.

In FIG. 10, in order to prevent the flow of the solder, the flow preventing film DM is formed to control the thickness of the solder. In contrast, in FIG. 12, since the flow of the solder can be prevented, such film DM is omitted. However, the flow preventing film DM may be provided.

The projected structure of the radiation electrode 15A is also applied to the semiconductor devices 10K, 10L described in the following.

[Thirteenth Embodiment Explaining the Semiconductor Device 10K]

Figure 12B:
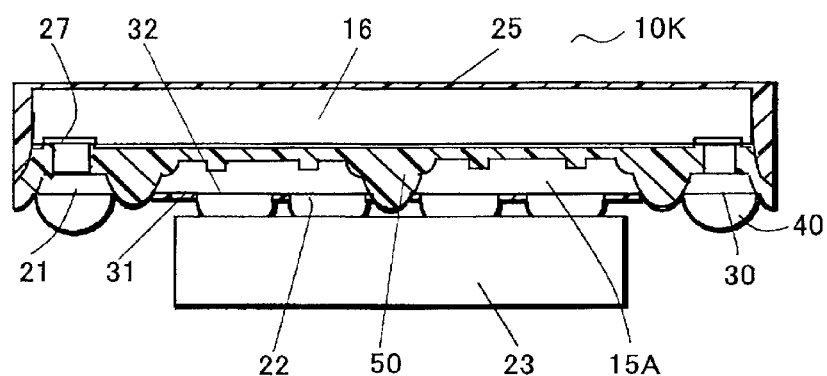

The semiconductor device 10K shown in FIG. 12B is the semiconductor device 10J shown in FIG. 12A to which the metal plate 23 is attached. The totally same concept as that in FIG. 7A, FIG. 11A is applied, wherein the back surface of the metal plate 23 is projected lower than the back surface of the external connection electrode 30 (or the lower ends of the solder balls 40). Accordingly, the back surface of the metal plate 23 can be brought into contact with the radiation substrate 13A shown in FIG. 9. The details are given in the explanation in FIG. 7A, FIG. 11A.

[Fourteenth Embodiment Explaining the Semiconductor Device 10L]

Figure 12C:
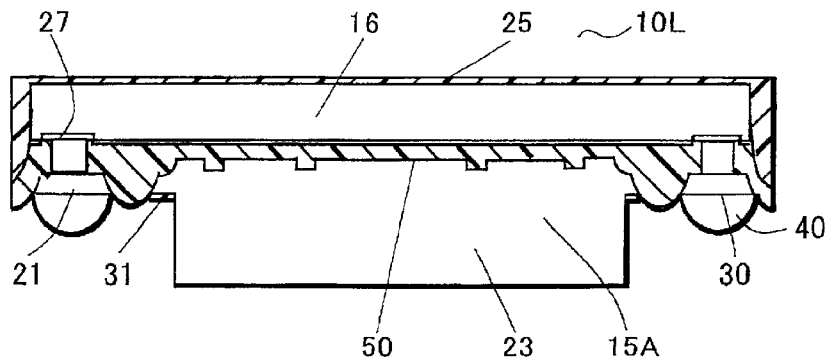

In the semiconductor device 10L shown in FIG. 12C, the radiation electrode 15A provide to the semiconductor device 10K shown in FIG. 12B and the metal plate 23 are integrally constructed. The totally same concept as that in FIG. 7B, FIG. 11B is applied, wherein the back surface of the metal plate 23 is projected lower than the back surface of the external connection electrode 30 (or the lower ends of the solder balls 40). Accordingly, the back surface of the metal plate 23 can be brought into contact with the radiation substrate 13 shown in FIG. 9. The details are given in the explanation in FIG. 7B, FIG. 11B.

[Fifteenth Embodiment Explaining the Semiconductor Module]

Figure 13:
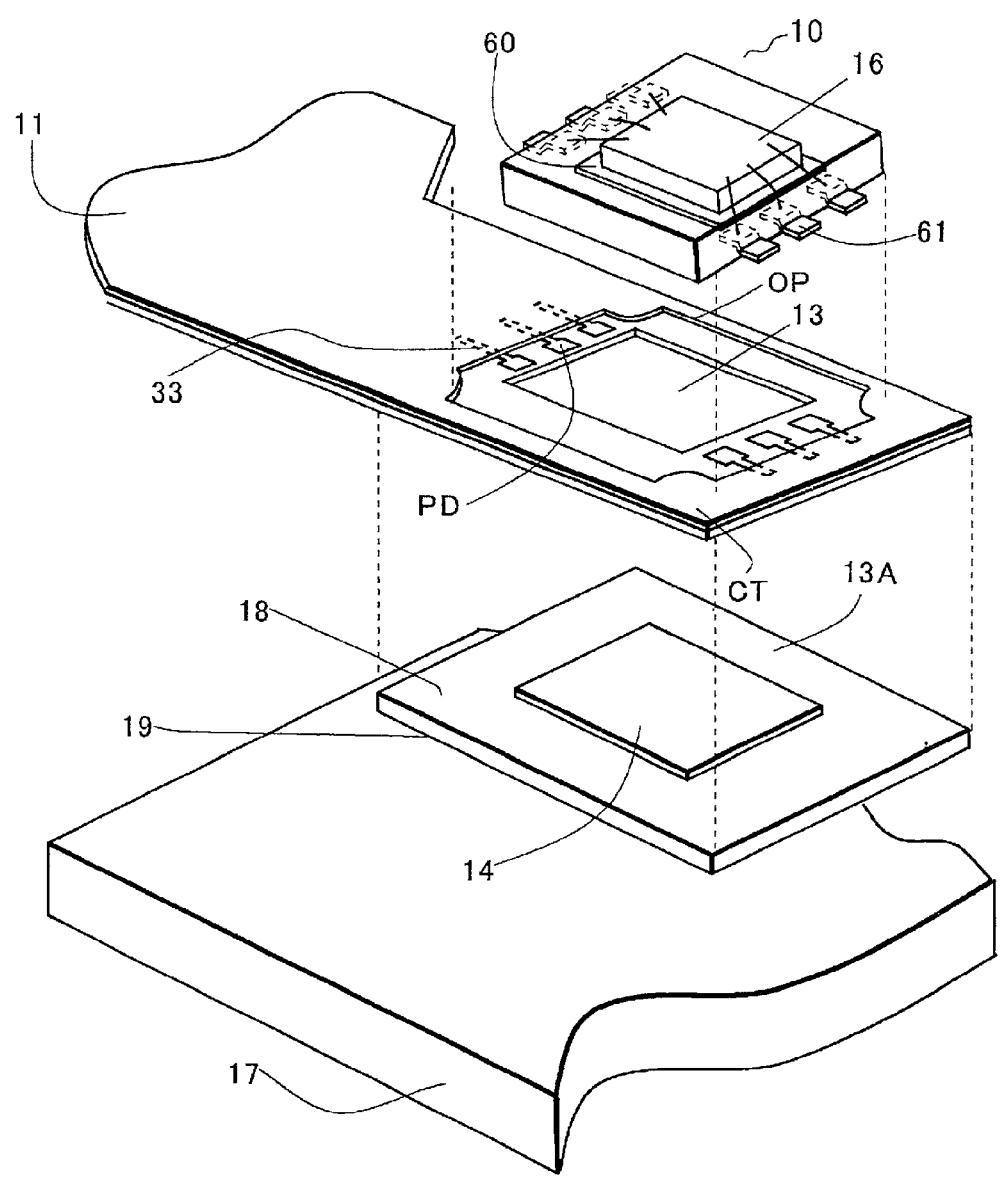
FIG. 13 is a view showing a semiconductor module of the present invention.

Then, the semiconductor module employing the lead frame will be explained by using FIG. 13. Since elements other than the semiconductor device 10 are similar to FIG. 1 and FIG. 9, only differences will be explained herein.

Figure 14:
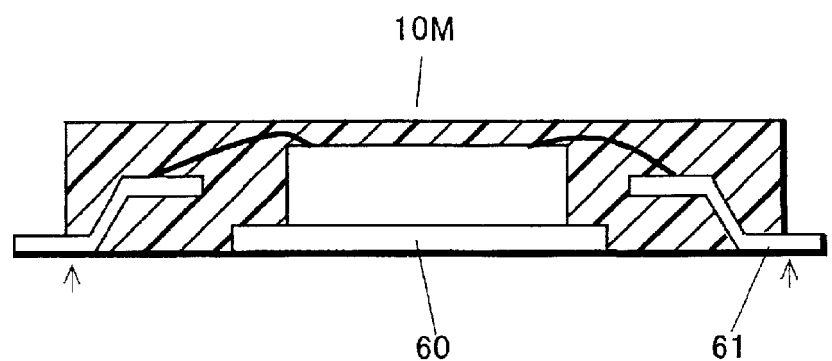
FIG. 14 is a view showing a semiconductor device of the present invention.
Figure 15:
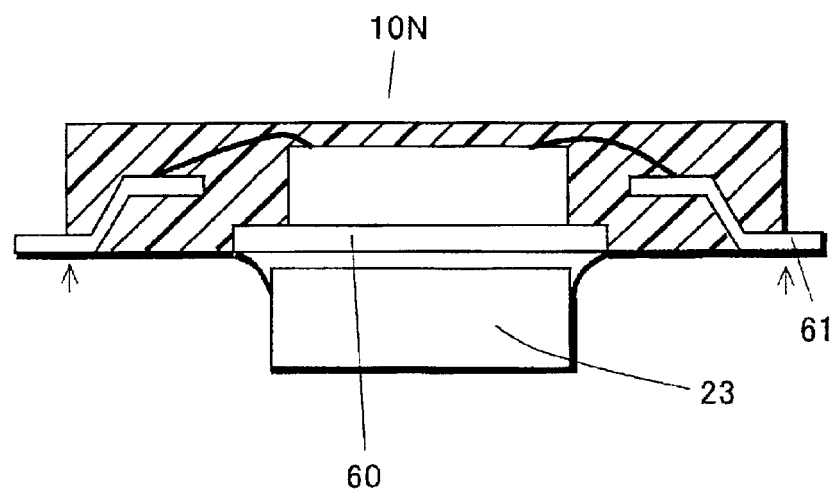
FIG. 15 is a view showing a semiconductor device of the present invention.

The semiconductor device employed herein are the semiconductor devices 10M, 10N shown in FIG. 14, FIG. 15.

Leads 61 are arranged around the island 60, then the island 60 and the leads 61 are constructed by lead frames that are supported by the supporting leads called tab lifting lead, or tie bar, then the semiconductor element 16 is mounted, then the wire bonding is applied, then the resultant structure is sealed by the transfer molding, and then the supporting leads are cut off, whereby the semiconductor device can be completed. In this case, there are the semiconductor devices in which the leads 61 are cut.

In the semiconductor device 10M shown in FIG. 14, the back surface of the island 60 and the back surface of the lead 61 are arranged substantially on the same surface level, and at least the back surface of the island 60 is exposed from the back surface of the package. Then, the pad electrodes PD on the flexible sheet 11 and the leads 61 are connected, and the back surface of the island 60 and the radiation substrate 13A or the back surface of the island 60 and the first metal film 14 on the radiation substrate 13A are adhered via the second opening portion 13. As the adhering material, the brazing solder such as the solder, etc., the conductive paste, etc. are preferable.

The island of the semiconductor device 10 may be brought directly into contact with the radiation substrate 13A on which the first metal film 14 is not formed.

In contrast, in the semiconductor device 10N shown in FIG. 15, the metal plate 23 is adhered to the island 60 and the back surface of the metal plate 23 is projected rather than the back surfaces of the leads 61. Accordingly, if the first metal film 14 is arranged lower than the conductive pattern 33 forming surface, the back surface of the metal plate 23 is projected by the length corresponding to such low arrangement, and the adhesion of the metal plate 23 and the first metal film 14 can be facilitated.

The island of the semiconductor device 10 maybe brought directly into contact with the radiation substrate 13A on which the first metal film 14 is not formed. Also, the island 60 and the metal plate 23 may be formed integrally.

[Sixteenth Embodiment Explaining the Method of Manufacturing Semiconductor Device]

The present manufacturing methods are almost identical although slightly different steps are employed depending upon that the semiconductor element is set face-up or face-down.

Here, the manufacturing method will be explained by using the semiconductor device 10A in FIG. 6.

Figure 16:
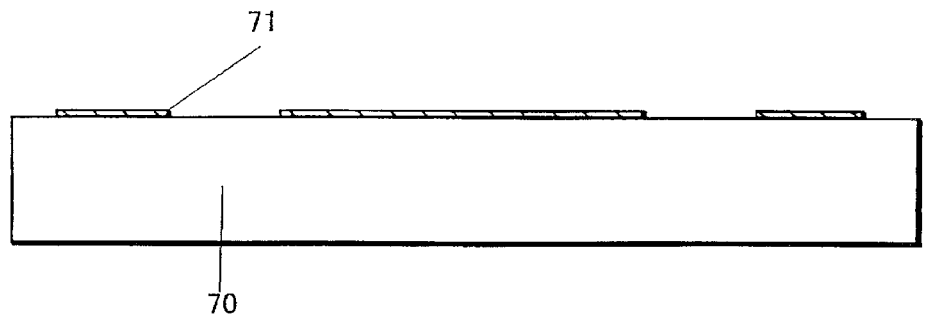
FIG. 16 is a view showing a method of manufacturing a semiconductor device of the present invention.

First, the conductive leaf 70 is prepared like FIG. 16. It is preferable that the thickness should be set to about 10 to 300 μm, and the rolled copper leaf of 70 μm thickness is employed here. Then, the conductive film 71 or the photoresist is formed on the surface of the conductive leaf 70 as the etching resistance mask. This pattern is the same pattern as the bonding pad 21 . . . , and the island 15 in FIG. 6A. If the photoresist is employed in place of the conductive film 71, a conductive film such as Au, Ag, Pd, Ni, or the like is formed in at least the areas corresponding to the bonding pads as the underlying layer of the photoresist. This is provided to enable the bonding (see FIG. 16).

Then, the conductive leaf 70 is half-etched via the conductive film 71 or the photoresist. The etching depth may be set shallower than the thickness of the conductive leaf 70. The finer pattern can be formed as the depth of the etching is shallower and shallower.

Then, the bonding pads 21 and the island 15 appears on the conductive leaf 70 like the convex shape by the half etching. As described above, the Cu leaf containing the Cu formed by rolling as the major material is employed as the conductive leaf 70. However, the conductive leaf made of Al, the conductive leaf made of Fe—Ni alloy, the Cu—Al laminated body, the Al—Cu—Al laminated body may be employed. Particularly, the Al—Cu—Al laminated body can prevent the bowing generated due to the difference in the thermal expansion coefficient.

Figure 17:
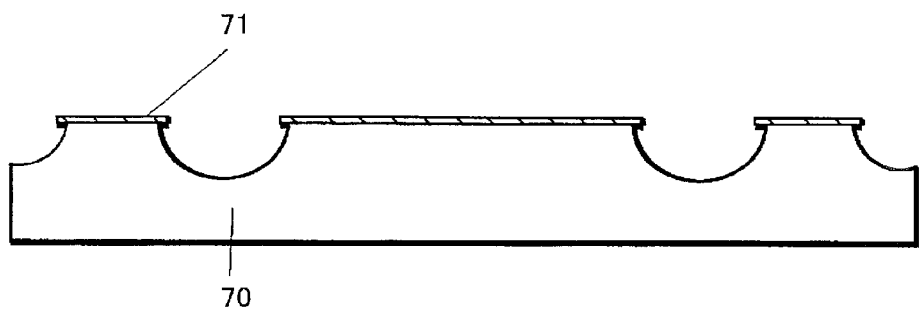
FIG. 17 is a view showing a method of manufacturing a semiconductor device of the present invention.
Figure 18:
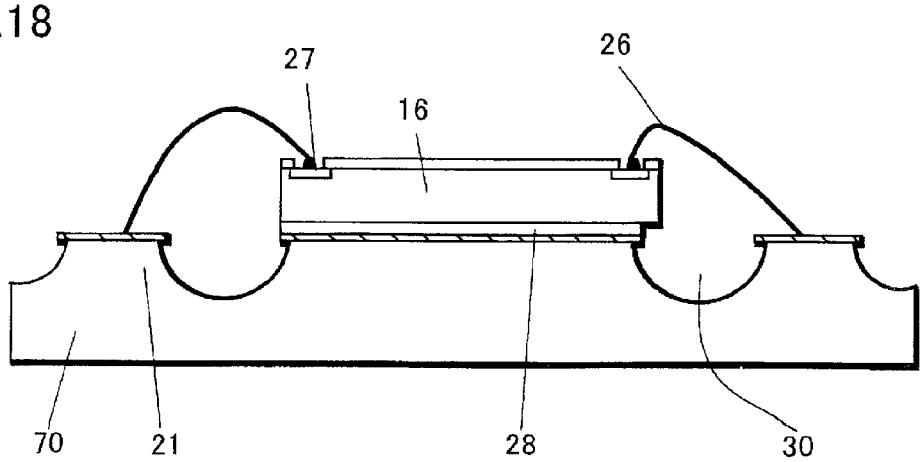
FIG. 18 is a view showing a method of manufacturing a semiconductor device of the present invention.

If the radiation electrode should be projected upward as shown in FIG. 12, first the area corresponding to the radiation electrode is made by half-etching, then the radiation electrode is covered with the photoresist, and then the area corresponding to the bonding electrode is made by half-etching once again (see FIG. 17).

Then, the conductive adhering means 28 or the insulating adhering means is provided to the area corresponding to the island 15, then the semiconductor element 16 is adhered, and then the bonding electrodes 27 of the semiconductor element 16 and the bonding pads 21 are electrically connected mutually. The semiconductor element 16 is mounted in a face-up fashion, the bonding wires 26 are employed as the connecting means. Also, in the case of the face down, the solder balls or the bumps are employed (see FIG. 18).

Then, the insulating resin 25 is formed to cover the bonding pads 21 formed by the half-etching, the semiconductor element 16, and the metal wires 26. Any of the thermoplastic resin and the thermosetting resin may be employed as the insulating resin.

In the present embodiment, the thickness of the insulating resin is adjusted to cover a height of about 100 μm upward from the top portion of the metal wires 26. This thickness can be increased or decreased in light of the strength of the semiconductor device.

In the resin injection, since the bonding pads 21, the island 15 are formed integrally with the sheet-like conductive leaf 70, positional displacement of the conductive leaf patterns are never generated unless the displacement of the conductive leaf 70 is caused. In addition, no resin flash is produced.

Figure 19:
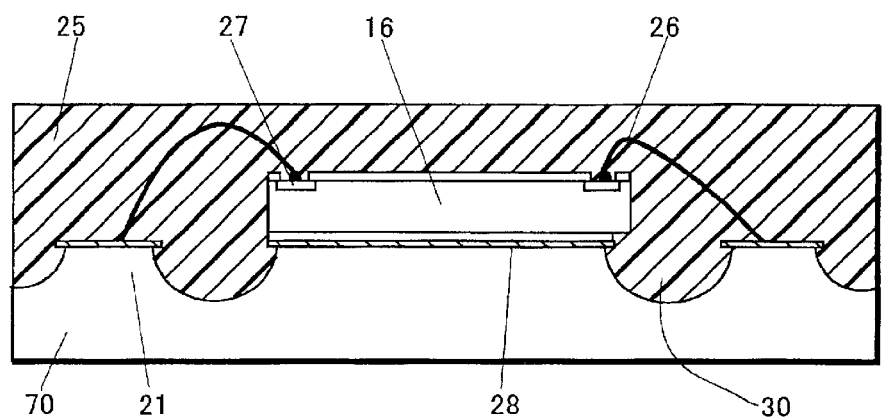
FIG. 19 is a view showing a method of manufacturing a semiconductor device of the present invention.
Figure 20:
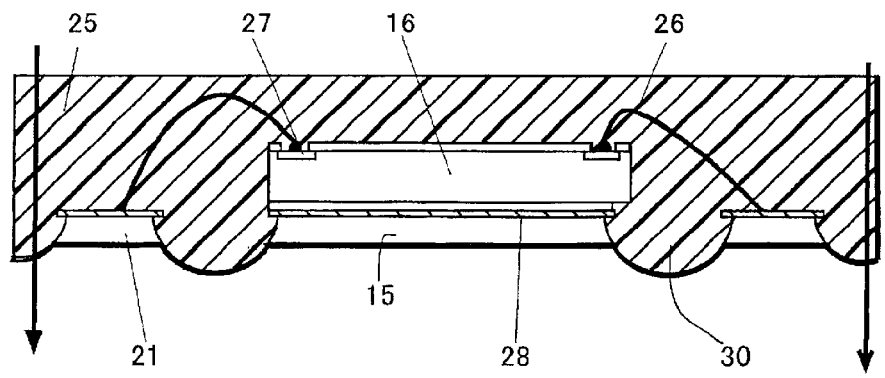
FIG. 20 is a view showing a method of manufacturing a semiconductor device of the present invention.

As described above, the bonding pads 21 and island 15 formed as the convex portions, and the semiconductor element 16 are buried into the insulating resin 25, and the conductive leaf 70 located lower than the convex portions is exposed from the back surface (see FIG. 19).

Then, the conductive leaf 70 exposed from the back surface of the insulating resin 25 is removed, and the bonding pads 21 and the island 15 are separated individually.

Various methods may be considered as this separating step. They may be separated by removing the back surface by the etching, or they may be separated by scraping by virtue of polishing or grinding. Also, both methods maybe employed.

Also, if a plurality of units each consisting of the semiconductor device 10A are formed integrally, the dicing step is added after this separating step.

They are separated individually by employing the dicing apparatus, but the chocolate brake, the press, or the cutting may be employed.

Here, after the Cu pattern is separated, the insulating film 31 is formed on the bonding pads 21 and the island 15 separated and exposed on the back surface, and then the insulating film 31 is patterned to expose the areas indicated by a dotted line in FIG. 6A. After this, the module is subjected to the dicing along the lines indicated by an arrow to cut out the semiconductor device 10A.

The solder 22 may be formed before or after the dicing.

According to the above manufacturing method, the small and lightweight package in which the bonding pads and the island a reburied in the insulating resin can be accomplished.

Then, the method of manufacturing the semiconductor device in which the metal plate 23 and the island 15 are formed integrally will be explained with reference to FIG. 21 to FIG. 23 hereunder. Since the similar steps maybe employed up to FIG. 19, the explanation made to there will be omitted.

FIG. 19 shows the state in which the insulating resin 25 is coated on the conductive leaf 70, wherein the photoresist PR is covered on the area corresponding to the island 15. If the conductive leaf 70 is etched via the photoresist PR, the island 15 can be projected from the back surfaces of the bonding pads 21, as shown in FIG. 22. The conductive film such as Ag, Au, etc. is selectively formed in place of the photoresist PR, and then may be used as a mask. This film can also act as the oxidation preventing film.

Then, as shown in FIG. 23, after the bonding pads 21 and the island 15 are perfectly separated, the insulating film 31 is coated, and then the areas at which the brazing solder 22 is arranged are exposed. Then, the brazing solder 22 is adhered and then the module is separated by the dicing at the portion indicated by an arrow.

The semiconductor device separated in this manner is mounted on the first supporting member 11, as shown in FIG. 1. As described above, since the island 15 is projected, it can be jointed simply to the first metal film 14 via the solder, etc.

In the semiconductor device explained in above all embodiments, the size of the island 15 (or the radiation electrode) may be reduced, the wirings formed integrally with the bonding pads 21 (or pads) may be extended to the back surface of the semiconductor element 16, and new external connecting electrodes may be provided there. This pattern is provided based on the same concept as the rewiring used in BGA, etc. There is such a merit that the stress in respective connecting portions can be relaxed by the rewiring. Also, since the wirings and the external connecting electrodes are provided on the back surface of the semiconductor element, the insulating adhering means 50 must be formed of insulating material. Also, the back surface of the rewiring is covered with the insulating film 31.

[Seventeenth Embodiment Explaining the Semiconductor Module]

As described above, in all modules, the second opening portion 13 is formed to expose the radiation substrate. However, the present invention may be applied to the module in which the second opening portion 13 is not formed at the sacrifice of the radiation characteristic, as shown in FIG. 24. The land is formed on the first insulating sheet P1, and then the island 15 or the metal plate of the semiconductor device 10 may be brought into contact with or adhered to this land. All semiconductor devices described above may be employed as this semiconductor device. Also, the radiation substrate 13 may be stuck to the back surface or may be omitted.

As apparent from the above explanation, the radiation substrate of the present invention has excellent heat radiating characteristic by forming the first metal film containing Cu, Ag, or Au as the major material on the radiation substrate containing Al as the major component.

Since the growth of the oxide film is small on the radiation substrate containing Al as the major material, the generation of particles is small correspondingly, and also the malfunction of the electronic equipment mounted in the inside can be reduced. In addition, the first metal film containing Cu, Ag, or Au as the major material can be formed on the surface of Al, and also the metal body (e.g., the island or the radiation electrode) exposed from the back surface of the semiconductor device can be thermally coupled with the first metal film via the conductive adhering material. Accordingly, such radiation substrate can serve as the radiation substrate that generates a small amount of particles and has excellent thermal conduction.

Also, the first metal film can be formed by the plating, and the radiation substrate having small thermal resistance can be implemented.

Also, since the semiconductor device in which the metal plate is adhered to the metal body exposed to the back surface of the package and the metal plate is projected rather than the back surfaces of the external connecting electrodes or the pads can be provided, there is such a merit that mounting into the FCA can be facilitated.

Also, since the opening portion is provided to the FCA and the back surface of the FCA and the radiation electrode of the semiconductor device are positioned on the same surface level, the contact to the second supporting member can be facilitated.

Also, since Al is used as the second supporting member, and the first metal film made of Cu is formed there, and the radiation electrode or the metal plate can be adhered to the metal film, the heat generated from the semiconductor element can be radiated to the outside via the second supporting member.

In addition, since the thickness of the solder can be assured by bringing the back surface of the semiconductor device into contact with the contact area and a part of the first opening portion is arranged on the outer side than the arranging area of the semiconductor device, the clearance provided on the back surface of the semiconductor device can be cleaned. Also, the underfill material can be mixed, and the reliability of connected portions of the solder balls can be improved.

Therefore, the temperature increase of the semiconductor element can be prevented, and thus the performance close to the natural ability can be extracted. In particular, since the FCA mounted in the hard disk can emit the heat to the outside effectively, the reading/writing speed of the hard disk can be increased.

What is claimed is:

1. A semiconductor module comprising:

a semiconductor device in which semiconductor elements are sealed integrally by an insulating resin and back surface electrodes that are electrically connected to the semiconductor elements are exposed from a back surface; and a flexible sheet having at least a plurality of conductive patterns, a first insulating sheet for supporting pad electrodes formed at end potions of said conductive patterns and electrically connected to said back surface electrodes, and a second insulating sheet for covering the conductive patterns;

wherein an opening portion from which the pad electrodes are exposed and whose size is larger than a back surface of the semiconductor device is formed in the second insulating sheet, and contact areas which come into contact with at least three areas of a back surface of the insulating resin are provided to the opening portion.

2. A semiconductor module according to claim 1, wherein the contact areas are formed of the second insulating sheet.

3. A semiconductor module according to claim 2, wherein the contact areas are formed integrally with the second insulating sheet.

4. A semiconductor module according to claim 1, wherein the contact areas are formed of material which is different from the second insulating sheet.

5. A semiconductor module comprising:

a semiconductor device in which semiconductor elements are sealed integrally by an insulating resin, back surface electrodes that are electrically connected to the semiconductor elements are exposed from a back surface at a same surface level as a back surface of the insulating resin or a hollow surface level rather than the back surface, and an island provided to a lower surface of the semiconductor element is exposed at the same surface level as the back surface of the insulating resin or the hollow surface level rather than the back surface; and a flexible sheet having at least a plurality of conductive patterns, a first insulating sheet for supporting pad electrodes formed at end potions of said conductive patterns and electrically connected to said back surface electrodes, and a second insulating sheet for covering the conductive patterns;

wherein a first opening portion from which the pad electrodes are exposed and whose size is larger than a back surface of the semiconductor device is formed in the second insulating sheet, and a second opening portion which exposes the island from a back surface of the first insulating sheet is formed in the first insulating sheet, and contact areas which come into contact with at least three areas of the back surface of the insulating resin are provided between the first opening portion and the second opening portion.

6. A semiconductor module according to claim 5, wherein the contact areas are formed of the second insulating sheet.

7. A semiconductor module according to claim 6, wherein the contact areas are formed integrally with the second insulating sheet.

8. A semiconductor module according to claim 5, wherein the contact areas are formed of material which is different from the second insulating sheet.

9. A semiconductor module according to any one of claim 5 to claim 8, wherein a radiation substrate is stuck onto a back surface of the first insulating sheet to close the second opening portion, and the radiation substrate and the island are thermally coupled with each other.

10. A semiconductor module according to claim 9, wherein a first metal film which contains Cu, Ag or Au as major material and is formed by plating is formed as an uppermost layer on a first surface of the radiation substrate, and the first metal film and the island are adhered to (or are brought into contact with) each other by brazing solder, conductive paste, or adhesive material which is excellent in thermal conductivity.

11. A semiconductor module according to claim 9, wherein the first surface of the radiation substrate and the island are adhered to (or are brought into contact with) each other by brazing solder, conductive paste, or adhesive material which is excellent in thermal conductivity.

12. A semiconductor module according to any one of claim 5 to claim 8, wherein a radiation substrate is stuck onto a back surface of the first insulating sheet to close the second opening portion, and a metal plate containing Cu as a major component is adhered between the radiation substrate and the island.

13. A semiconductor module according to claim 12, wherein the island and the metal plate are substantially formed of same material.

14. A semiconductor module according to claim 12, wherein the radiation substrate and the metal plate are formed integrally of same material.

15. A semiconductor module comprising:

a semiconductor device in which semiconductor elements are sealed integrally in a face-up or face-down fashion by an insulating resin, back surface electrodes that are electrically connected to bonding electrodes of the semiconductor elements are exposed from a back surface at a same surface level as a back surface of the insulating resin or a hollow surface level rather than the back surface, and an island provided to a lower surface of the semiconductor element is exposed at the same surface level as the back surface of the insulating resin or the hollow surface level rather than the back surface; and a flexible sheet having at least a plurality of conductive patterns, a first insulating sheet for supporting pad electrodes formed at end potions of said conductive patterns and electrically connected to said back surface electrodes, and a second insulating sheet for covering the conductive patterns;

wherein a first opening portion from which the pad electrodes are exposed and whose size is larger than a back surface of the semiconductor device is formed in the second insulating sheet, and a second opening portion from which a radiation substrate being stuck onto an area corresponding to the island is exposed is provided to a back surface of the first insulating sheet, and contact areas which come into contact with at least three areas of the back surface of the insulating resin are provided between the first opening portion and the second opening portion, and the contact areas come into contact with the back surface of the insulating resin, and the island and the radiation substrate are thermally coupled with each other.

16. A semiconductor module according to claim 15, wherein side surfaces of the back surface electrodes and the back surface of the insulating resin extended from the side surfaces of the back surface electrodes have a same curved surface.

17. A semiconductor module according to claim 15 or claim 16, wherein the semiconductor element is a read/write amplifier IC of a hard disk.

* * * * *